(12) United States Patent
Hiruma et al.

(10) Patent No.: US 8,519,378 B2
(45) Date of Patent: Aug. 27, 2013

(54) SEMICONDUCTOR LIGHT-EMITTING ELEMENT ARRAY INCLUDING A SEMICONDUCTOR ROD

(75) Inventors: Kenji Hiruma, Sapporo (JP); Shinjiro Hara, Sapporo (JP); Junichi Motohisa, Sapporo (JP); Takashi Fukui, Sapporo (JP)

(73) Assignees: National University Corporation Hokkaido University, Hokkaido (JP); Sharp Kabushiki Kaisha, Osaka (JP)

( * ) Notice: Subject to any disclaimer, the term of this patent is extended or adjusted under 35 U.S.C. 154(b) by 166 days.

(21) Appl. No.: 13/124,493

(22) PCT Filed: Oct. 17, 2008

(86) PCT No.: PCT/JP2008/002956
§ 371 (c)(1),
(2), (4) Date: Apr. 15, 2011

(87) PCT Pub. No.: WO2010/044129
PCT Pub. Date: Apr. 22, 2010

(65) Prior Publication Data
US 2011/0204327 A1 Aug. 25, 2011

(51) Int. Cl.
*H01L 29/06* (2006.01)
(52) U.S. Cl.
USPC ..................................... 257/13; 257/E33.048
(58) Field of Classification Search
USPC ........ 257/12, 13, E33.008, E33.048; 438/47; 977/825, 759
See application file for complete search history.

(56) References Cited

U.S. PATENT DOCUMENTS 6,844,572 B2    1/2005    Sawaki et al.
7,087,932 B2    8/2006    Okuyama et al.
(Continued)

FOREIGN PATENT DOCUMENTS

JP    4-212489 A    8/1992
JP    5-251738 A    9/1993
(Continued)

OTHER PUBLICATIONS

Arai et al., "Multiple-Wavelength GaInAs—GaAs Vertical Cavity Surface Emitting Laser Array With Extended Wavelength Span", IEEE Journal of Selected Topics in Quantum Electronics, vol. 9, No. 5, pp. 1367-1373, Sep./Oct. 2003.

(Continued)

*Primary Examiner* — Bilkis Jahan
(74) *Attorney, Agent, or Firm* — Birch, Stewart, Kolasch & Birch, LLP

(57) ABSTRACT

Semiconductor surface emitting elements having a plurality of wavelengths being manufactured on a signal substrate through MOVPE selective growth. More specifically, provided is a semiconductor light emitting element array which comprises; a semiconductor crystal substrate; an insulating film disposed on a surface of the substrate, the insulating film being divided into two or more regions, each of which having two or more openings exposing the surface of the substrate; semiconductor rods extending from the surface of the substrate upward through the openings, the semiconductor rods each having an n-type semiconductor layer and a p-type semiconductor layer being laminated in its extending direction, thereby providing a p-n junction; a first electrode connected to the semiconductor crystal substrate; and a second electrode connected to upper portions of the semiconductor rods; wherein the heights of the semiconductor rods as measured from the substrate surface vary by each of the two or more regions.

14 Claims, 25 Drawing Sheets

(56) References Cited

U.S. PATENT DOCUMENTS

| | | |
|---|---|---|
| 7,088,321 B1 | 8/2006 | Parker |
| 2002/0028390 A1 | 3/2002 | Mazed |
| 2005/0082543 A1 | 4/2005 | Alizadeh et al. |
| 2006/0134883 A1* | 6/2006 | Hantschel et al. ............ 438/458 |
| 2007/0032076 A1* | 2/2007 | Lee et al. ...................... 438/666 |
| 2008/0149946 A1 | 6/2008 | Kim et al. |

FOREIGN PATENT DOCUMENTS

| | | |
|---|---|---|
| JP | 7-183576 A | 7/1995 |
| JP | 10-70331 A | 3/1998 |
| JP | 10-233559 A | 9/1998 |
| JP | 2001-517866 A | 10/2001 |
| JP | 2002-100804 A | 4/2002 |
| JP | 2003-158296 A | 5/2003 |
| JP | 2003-347585 A | 12/2003 |
| JP | 2004-533111 A | 10/2004 |
| JP | 2007-123398 A | 5/2007 |
| JP | 2008-166567 A | 7/2008 |

OTHER PUBLICATIONS

International Search Report, dated Nov. 11, 2008, for Application No. PCT/JP2008/002956.

Noborisaka et al., "Catalyst-free growth of GaAs nanowires by selective-area metalorganic vapor-phase epitaxy", Applied Physics Letters, vol. 86, pp. 213102-1 to 213102-3, 2005 (Published online May 16, 2005).

Onomura et al., "Densely Integrated Multiple-Wavelength Vertical-Cavity Surface-Emitting Laser Array", Jpn. J. Appl. Phys., vol. 42, Part 2, No. 5B, pp. LL529-LL531, May 15, 2003.

Yang et al., "Size-dependent photoluminescence of hexagonal nanopillars with single InGaAs/GaAs quantum wells fabricated by selective-area metal organic vapor phase epitaxy", Applied Physics Letters, vol. 89, pp. 203110-1 to 203110-3, 2006 (Published online Nov. 15, 2006).

Japanese Office Action for corresponding Japanese Patent Application No. 2007-214119, dated Feb. 14, 2012.

European Search Report issued Apr. 29, 2013.

* cited by examiner

LONGITUDINAL
DIRECTION

LONGITUDINAL
DIRECTION

SEMICONDUCTOR LIGHT-EMITTING ELEMENT ARRAY INCLUDING A SEMICONDUCTOR ROD

TECHNICAL FIELD

The present invention relates to a semiconductor light-emitting element array, and to a manufacturing method thereof.

BACKGROUND ART

Conventionally, light-emitting elements which use light emission from semiconductor rods have been developed (see Patent Literature 1). For example, a light-emitting element disclosed in Patent Literature 1 is a light-emitting element including semiconductor rods having p-n junctions and formed on a semiconductor substrate, with an electrode disposed on the substrate and an electrode disposed on the rod and the semiconductor rods being equally spaced from each other. This light-emitting element emits light in a direction either perpendicular to or in parallel with the surface of the substrate.

A semiconductor light-emitting element array including light-emitting elements and utilizing light emission from semiconductor rods to emit multiple colors of light is also known (see Patent Literature 2 and 3). For example, Patent Literature 2 proposes a light-emitting element including a multiple quantum well structure formed by repeatedly (e.g., three times) laminating a combination of a well layer and a barrier layer, to thereby emit multicolored light by adjusting the thickness of each well layer. It is also proposed that the emitted light having multiple colors is passed through a transparent film (or a wavelength-selecting filter) which transmits only a desired single color wavelength for wavelength selection of light.

Patent Literature 3 discloses a light-emitting element including two or more active layers, with each active layer having a pair of electrodes. This light-emitting element emits multicolored light upon application of a predetermined voltage to each electrode pair, thereby causing light emission from each active layer.

Selective-Area Metal Organic Vapor Phase Epitaxy (Selective-Area MOVPE) is known as one of important technologies to form nanopillar-shaped semiconductor rods (see Non-Patent Literature 1 and 2). MOVPE is a method to grow semiconductor crystals selectively at specific exposed areas of a semiconductor crystal substrate by MOVPE. It is reported in Non-Patent Literature 1 and 2 that the thickness and/or the height of the semiconductor crystals to be grown can be controlled by adjusting the exposed areas of the semiconductor crystal substrate. For example, the height of the grown rods (or nanopillars) becomes taller as the diameter of the exposed area is reduced, while the rods become taller when the spacing between the exposed areas (or pitch) is reduced. Needless to say, the rods become thicker as the area of the exposed portion is increased.

Meanwhile, technologies to fabricate a surface light-emitting element used for multiple wavelengths have been reported (see Non-Patent Literature 3 and 4). These documents relate to technologies for growing a thin film of a GaInAs/GaAs quantum well structure for the surface light-emitting element. In this technology, a plurality of linear and convex shaped steps (which are called "mesas") are formed in parallel with each other on the surface of a GaAs (001) substrate. Subsequently, a multi-layered thin film is disposed on the substrate by MOCVD (Metal Organic Chemical Vapor Deposition). During the process, a thin film is disposed thickly on the top surface of the mesas, while a thinner film is disposed on the surface of the valley between the neighboring mesas.

The thickness of the thin film disposed on the surface of the valley between the mesas can be controlled depending on factors (which are also called "control parameters"), such as the width of the mesas, the depth (or height) of the steps, the spacing between the neighboring mesas, and the like. In other words, the distribution of the thickness of the film formed by MOCVD thin film epitaxy is determined by these control parameters and, therefore, the wavelength of light emitted from the light-emitting element fabricated by this method can be controlled. Proper control of the thickness of the thin film (or the wavelength of the light emitted from the light-emitting element) requires precise design and fabrication of the mesas.

Patent Literature 1: JP 4-212489 A
Patent Literature 2: JP 2003-347585 A
Patent Literature 3: JP 7-183576 A
Non-Patent Literature 1: Noborisaka, J. et al., "Catalyst-free growth of GaAs nanowires by selective-area metal organic vapor-phase epitaxy", Applied Physics Letters, vol. 86, p. 213102-1-213102-3 (2005)
Non-Patent Literature 2: Yang, L. et al., "Size-dependent photoluminescence of hexagonal nanopillars with single InGaAs/GaAs quantum wells fabricated by selective-area metal organic vapor phase epitaxy", Applied Physics Letters, vol. 89, pp. 203110-1-203110-3 (2006)
Non-Patent Literature 3: M. Arai, et al., "Multiple-wavelength GaInAs—GaAs vertical cavity surface emitting laser array with extended wavelength span", IEEE Journal of Selected Topics in Quantum Electronics, vol. 9, No. 5, (2003) pp. 1367-1373
Non-Patent Literature 4: A. Onomura, et al., "Densely integrated multiple-wavelength vertical cavity surface-emitting laser array", Japanese Journal of Applied Physics, vol., 42 (2003) pp. L529-L531.

SUMMARY OF THE INVENTION

Technical Problem

A plurality of light-emitting elements which emit light beams having different wavelengths and formed on the same substrate may be applicable to a communication system called a wavelength multiplexed system, which is an advantageous method for long distance communication. It is, therefore, desired to provide a convenient method for manufacturing a semiconductor light-emitting element having a simple structure, including a plurality of light-emitting elements formed on the same substrate to emit light of different wavelengths.

The problem with conventional technologies, however, is that additional process steps are necessary to provide separate members after the growth of semiconductor crystals, in order to fabricate the semiconductor surface light-emitting elements having multiple wavelengths on the same substrate. In particular, the semiconductor light-emitting elements disclosed in Patent Literature 2 emit light of multiple wavelengths from respective parts of the semiconductor crystal, and the necessary wavelength is extracted by means of the wavelength-selecting filter. Thus, the step of forming the wavelength-selecting filter should be added. Similarly, the semiconductor light-emitting elements disclosed in the Patent Literature 3 include lamination of crystal film portions corresponding to multiple light-emitting wavelengths, so that the step of forming a multi-stepped electrode structure, with each step having different etching depths of the semiconductor film, is necessary for extracting the light of respective wavelengths separately and independently.

Further, in the technologies disclosed in the Non Patent Literature 2 and 3, if the mesas formed on the substrate are not arranged in a tapered manner at a predetermined width along a longitudinal direction, or otherwise arranged, such as being crossed with each other, curved, or arranged concentrically, difficulty is encountered in controlling the thickness of the film during growth of the thin film. Therefore, the freedom of design is limited for the surface light-emitting element having multiple wavelengths.

A wavelength interval between the light-emitting elements used for coarse WDM communications over the bandwidth of 1 μm is 10 nm. If it is desired to have a 10 nm wavelength interval between the light-emitting elements according to the technologies disclosed in the Non-Patent Literature 2 and 3, the spacing between the elements needs to be at least 500 μm. Therefore, when the multimode optical fiber (having a core diameter of 50 μm to 65 μm) is optically coupled with the light-emitting element array, different optical fibers should be connected to respective light-emitting elements having different wavelengths.

Solution of the Problem

The inventors of the present invention have studied a manufacturing method of a semiconductor surface light-emitting element (or a multiple wavelength surface light-emitting element) including a plurality of light-emitting elements which emit light of different wavelengths and formed on the same substrate by Selective-Area MOVPE or the like. Consequently, a method to manufacture a multiple wavelength surface light-emitting element having a higher freedom of design has been found and thus the present invention is accomplished.

Specifically, a first embodiment of the present invention relates to a semiconductor light-emitting element array.

(1) A semiconductor light-emitting element array, including:
a semiconductor crystal substrate;
an insulating film disposed on a surface of the substrate, the insulating film being divided into two or more regions, each having two or more openings exposing the surface of the substrate;
semiconductor rods extending upward from the surface of the substrate through the openings, the semiconductor rods each having an n-type semiconductor layer and a p-type semiconductor layer being laminated in its extending direction, thereby providing a p-n junction;
a first electrode connected to the semiconductor crystal substrate, and a second electrode connected to upper portions of the semiconductor rods,
wherein the heights of the semiconductor rods as measured from the substrate surface vary among the two or more regions.

It is noted herein that the order of lamination of the n-type semiconductor layer and the p-type semiconductor layer formed in the semiconductor rods may be either the p-type followed by the n-type, or the n-type followed by the p-type, when seen from the substrate.

(2) A semiconductor light-emitting element array according to (1) above, wherein the semiconductor rods have a p-n hetero junction.

(3) A semiconductor light-emitting array according to (1) above, wherein the semiconductor rods have a quantum well structure.

(4) A semiconductor light-emitting array according to (1) above, wherein an average area of the openings varies among the two or more regions.

(5) A semiconductor light-emitting array according to (1) above, wherein an average center-to-center distance of the openings varies among the two or more regions.

(6) The semiconductor crystal substrate is made of a semiconductor material selected from the group consisting of GaAs, InP, Si, InAs, GaN, SiC, and $Al_2O_3$, and the surface of the substrate having the insulating film disposed thereon is a crystal axis (111) surface.

(7) A semiconductor light-emitting array according to (1) above, wherein the semiconductor rods are formed by metal organic chemical vapor deposition (MOCVD) or molecular beam epitaxy (MBE).

(8) A semiconductor light-emitting array according to (1) above, wherein the first electrode is an n-type electrode, and the second electrode is a p-type transparent electrode.

(9) A semiconductor light-emitting array according to (1) above, wherein the first electrode is a p-type electrode and the second electrode is an n-type transparent electrode.

A second embodiment of the present invention relates to a manufacturing method of a semiconductor light-emitting element array.

(10) A method for manufacturing a semiconductor light-emitting element array according to (1) above, including the steps of:
A) preparing a semiconductor crystal substrate having a surface of a crystal axis (111) covered by an insulating film, wherein
the insulating film is divided into two or more regions, and
each of the two or more regions has an opening exposing the surface of the crystal axis (111); and
B) forming semiconductor rods extending from the surface of the semiconductor crystal substrate covered by the insulating film upward through the openings, by means of metal organic chemical vapor deposition or molecular beam epitaxy, wherein the step further including the steps of:
forming an n-type semiconductor layer and a p-type semiconductor layer.

In step B), no limitation is imposed on the order of forming the n-type semiconductor layer and forming the p-type semiconductor layer, and the p-type semiconductor layer may be formed after the n-type semiconductor layer, or the n-type semiconductor layer may be formed after the p-type semiconductor layer.

A third embodiment of the present invention relates to an optical transmitter.

(11) An optical transmitter including the semiconductor light-emitting element array according to (1) above, and an optical waveguide arranged in each of the two or more regions to receive light from the semiconductor rods located in the region.

(12) An optical transmitter including the semiconductor light-emitting element array according to (1) above, and an optical waveguide for receiving light from the semiconductor rods located in each of the two or more regions.

(13) An optical transmitter including the semiconductor light-emitting element array according to (1) above, an optical multiplexer for multiplexing light from the semiconductor rods located in each of the two or more regions, and an optical waveguide for receiving multiplexed light from the optical multiplexer.

A fourth embodiment according to the present invention is an illuminator.

(14) An illuminator including the semiconductor light-emitting element array according to (1) above, and an optical waveguide for receiving light from the semiconductor rods located in each of the two or more regions.

(15) An illuminator including the semiconductor light-emitting element array according to (1) above, an optical multiplexer for multiplexing light from the semiconductor rods located in each of the two or more regions, and an optical waveguide for receiving multiplexed light from the optical multiplexer.

Advantageous Effects of the Invention

According to the present invention, there is provided a semiconductor light-emitting element array including a plurality of light-emitting elements formed on the same substrate, respectively emitting different wavelengths of light. The semiconductor light-emitting element array of the present invention has a simple structure and can be manufactured easily.

In particular, factors such as the shape and size (i.e., cross-sectional area) of the semiconductor rods, the spacing between the semiconductor rods, and the arrangement of the semiconductor rods are controlled depending on the shape and arrangement of the insulating film pattern (or openings), so that the intended semiconductor rod(s) can be fabricated easily. The wavelength of light emitted from the semiconductor rods can also be controlled easily.

For example, five semiconductor rods may be provided within a region of 10 μm×10 μm to make a light-emitting element consisting of a set of five semiconductor rods and having an output power of 1 mW. In addition, even by considering the margin for the wiring space and the manufacturing steps, the spacing between the light-emitting elements on the light-emitting element array can be reduced to as narrow as about 20 μm. Therefore, when the multiple mode optical fiber (e.g., having a core diameter of 50 μm) is coupled with the light-emitting element array, it is possible to guide the light from the plurality of light-emitting elements having different light emission wavelengths directly into the same optical fiber. Consequently, four-wave multiplexed communication may be realized using one optical fiber in coarse WDM (CWDM) communication without using the optical multiplexer.

BRIEF DESCRIPTION OF THE DRAWINGS

FIG. 1 shows procedures to form semiconductor rods having different heights on a single substrate (Embodiment 1);
FIG. 8 shows procedures to form semiconductor rods having different heights on a single substrate (Embodiment 2)

DESCRIPTION OF THE PREFERRED EMBODIMENTS

1. Semiconductor Light-Emitting Array

Figure 1A:
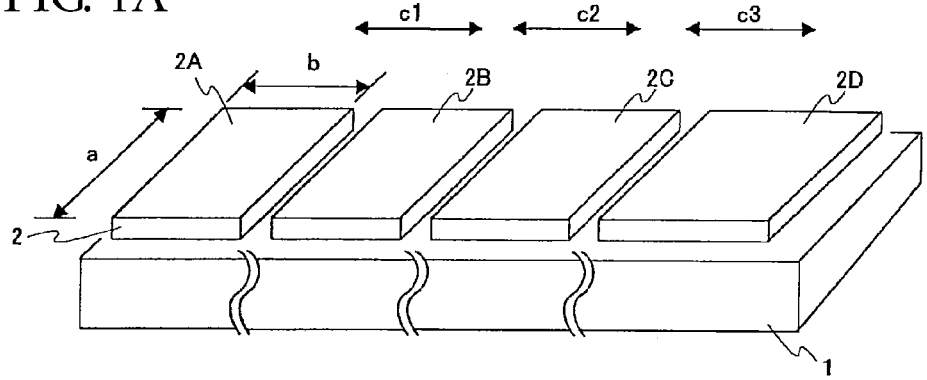
FIG. 1A shows a substrate covered by an insulating film.

A semiconductor light-emitting element array includes 1) a semiconductor crystal substrate, 2) an insulating film disposed on the surface of the semiconductor crystal substrate, and having openings exposing the surface of the substrate, 3) semiconductor rods extending from the surface of the substrate upward through the openings, the semiconductor rods each having a p-n junction, 4) a first electrode connected to the semiconductor crystal substrate; and a second electrode connected to upper portions of the semiconductor rods.

The insulating film is divided into several regions, and the heights of the semiconductor rods as measured from the substrate surface vary among the regions.

The substrate in the semiconductor light-emitting element according to the present invention may be of any material, so long as it is a semiconductor crystal, such as GaAs, InP, Si, InAs, GaN, SiC, Al$_2$O$_3$, or the like.

No particular limitation is imposed on the material of the insulating film disposed on the surface of the substrate, which may be any inorganic insulating material, such as SiO$_2$, SiN, or the like. The insulating film may be formed by sputtering or other like methods, and the thickness of the film may be a few tens of nm.

The surface of the substrate where the insulating film is disposed is the surface of the crystal axis (111) of the semiconductor crystal that forms the substrate. By growing the semiconductor rods from the surface of the crystal axis (111), it is possible to extend the semiconductor rods in the direction of the crystal axis (111) of the semiconductor crystal, thereby improving the efficiency of the light-emitting element, including laser oscillation efficiency caused by the symmetric nature of crystals.

The insulating film disposed on the surface of the substrate is divided into two or more regions. As used herein, the term "divided" means that the insulating film is physically cut and divided, or the insulating film may be a continuous film and virtually divided into multiple regions. When physically divided, each region of the film may be separated at least a few micrometers, preferably about 50 μm-100 μm, apart from each other.

Each of the two or more regions of the insulating film forms the light-emitting element region from where light beams having different wavelengths are emitted.

No specific limitation is imposed on the size of the each region of the insulating film, which may be set suitably depending on various factors, such as the number of semiconductor rods formed thereon. When combined with an optical waveguide to form an optical transmitter (see FIG. 18), the area of the each region of the insulating film where the semiconductor rods are disposed should be nearly equal to or less than the size of the core of the optical waveguide. As such, if the diameter of the core of the optical waveguide is 50 μm, each region of the insulating film may be rectangular of a size of about 100 μm.

Moreover, no specific limitation is imposed on t distance between respective regions of the insulating film. Again, when combining with the optical waveguide to form the optical transmitter, the distance between respective regions may be set so as to match the pitch of arranging the optical waveguide. Generally, the distance between the respective regions of the insulating film is from about a few μm to a few hundreds of μm.

Two or more openings are formed in each region of the insulating film, with the openings penetrating through the film and extending to the surface of the substrate. Semiconductor rods are grown from these openings. Two or more openings should be formed in each region of the film and, in general, preferably ten or more openings are provided. The openings may be of any shape, including rectangular, triangular, hexagonal, or circular.

Preferably, an opening area of the openings of each region is fixed. For example, the opening area may have a diameter of about 10 nm to 2 μm, given that the opening is circular. In addition, it is preferable that the openings are equally arranged. As used herein, the term "equally arranged" represents, e.g., that an equal and constant distance is provided between the openings. The distance between the openings may be not more than about 3 μm.

The openings can be formed by removing a part of the insulating film formed on the surface of the semiconductor crystal substrate by photolithography or electron-beam lithography.

Further, the semiconductor light-emitting element array according to the present invention is characterized in that 1) an average opening area of the openings differs among the regions of the insulating film, or 2) a density of the openings per unit area (e.g., an average distance or interval between the openings) differs among the regions of the insulating film. Given the longitudinal direction (or the x direction) and the lateral direction (or the y direction) of the plane of the insulating film, the distance or interval between the openings may be (1) identical in both the x and y directions, or (2) different for the x and y directions, respectively. That is, the average distance between the openings may differ among regions of the insulating film.

Thus, it is possible to form the semiconductor rods having different heights in respective regions.

The semiconductor light-emitting element array according to the present invention includes the semiconductor rods extending from the surface of the substrate exposed through the openings, and the semiconductor rods may be formed, e.g., by vapor phase deposition that utilizes thermal decomposition of organic metals (which will be described in detail later). The growing speed of the semiconductor rods is slowed as 1) the opening areas become wider, while the speed is faster as the openings become smaller. In other words, the smaller the opening areas of the openings, the longer the semiconductor rods grow within a predetermined growth time. In addition, the semiconductor rods grow faster as 2) the density of the openings (the density) becomes higher, and grow slower as the density becomes lower. Thus, the higher the density of the openings, the longer the semiconductor rods are formed within a predetermined growth time.

As mentioned above, the semiconductor light-emitting array according to the present invention includes the semiconductor rods extending from the surface of the substrate exposed through the openings formed in the insulating film. In other words, each region includes two or more semiconductor rods, depending on the number of openings. Preferably, the semiconductor rods of each region have the same length and thickness.

A semiconductor component which forms the semiconductor rods may consist of two, three, four, or more than four elements, Examples of the semiconductor consisting of two elements include GaAs, InP, InAs, GaN, ZnS, SiC, ZnTe, and the like. Examples of the semiconductor consisting of three elements include AlGaAs, InGaAs, GaInP, InGaN, AlGaN, ZnSSe, GaNAs, and the like. Examples of the semiconductor consisting of four elements include InGaAsP, InGaAlN, AlInGaP, GaInAsN, and the like.

Preferably, the semiconductor rods disposed in each region have p-n junctions. The term "p-n junction" means that the p-type region is in contact with the n-type region in the semiconductor crystal. In the semiconductor rods, it is preferable that the p-type region and the n-type region are laminated in the expanding direction of the semiconductor rods. In other words, the plane of the p-n junction is preferably perpendicular to the expanding direction of the semiconductor rods, and in parallel with the substrate. The lamination may be formed in the order of either "the p-type region followed by the n-type region" or "the n-type region followed by the p-type region" in the expanding direction.

The semiconductor light-emitting element array according to the present invention emits light from the surface of the p-n junction of the semiconductor rods when a voltage is applied to both electrodes (including a p-electrode and an n-electrode which will be described later). At this time, if the top and bottom end surfaces of the semiconductor rods are perpendicular to the extending direction of the semiconductor rods, and if the light propagation loss inside the rods is small, light is emitted in the same direction as the extending direction of the semiconductor rods.

The semiconductor rods according to the present invention may include the p-n junction, and a hetero junction as well. A hetero junction is made of semiconductors of dissimilar compositions bonded by an interface which exhibits rapid composition change. The semiconductor materials which form the p-n junction may be suitably selected to control the wavelength of light emission. Also, to impart an efficient light-emitting function to the semiconductor rods having both the p-n junction and the hetero junction, a quantum well structure may be adopted. If the quantum well structure is made of an intrinsic semiconductor, or the portions of the semiconductor other than the quantum well structure are formed by an intrinsic structure and inserted into the bonding interface of the p-n junction, a "pin" structure is formed, which improves the light emission efficiency as compared with the case where the intrinsic semiconductor is not used.

The quantum well structure is made by a semiconductor layer of a smaller band gap (a quantum well layer) sandwiched by different semiconductor layers of a larger band gap (barrier layers). Electrons are confined in the semiconductor layer of a smaller band gap (the quantum well layer). Movement of electrons in a direction perpendicular to the semiconductor film is quantized to provide discrete energy.

Preferably, the semiconductor rods according to the present invention includes the quantum well structure. When the quantum well structure is formed in the semiconductor rods, it is preferable that the thickness of the quantum well layer of the semiconductor rods within the same region of the insulating film is constant, and that the thickness of the quantum well layer of the semiconductor rods varies among the regions of the insulating film. As such, because the wavelength of the emitted light varies depending on the thickness of the quantum well layer, a semiconductor light-emitting element array which emits multicolored light can be provided by controlling the thickness of the quantum well layer for each region of the insulating film.

Figure 11A:
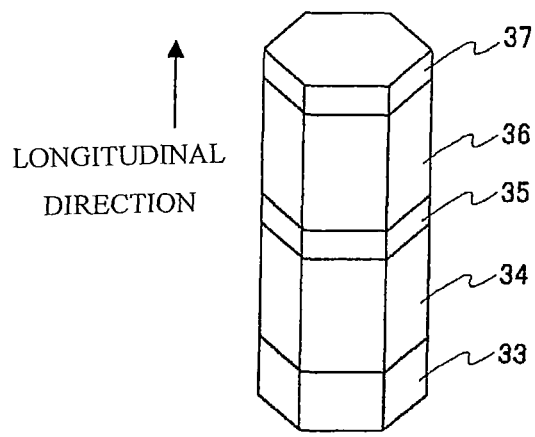
FIG. 11 is an example of the semiconductor rod having the quantum well layer made of a GaAs/AlGaAs layer.
Figure 11B:
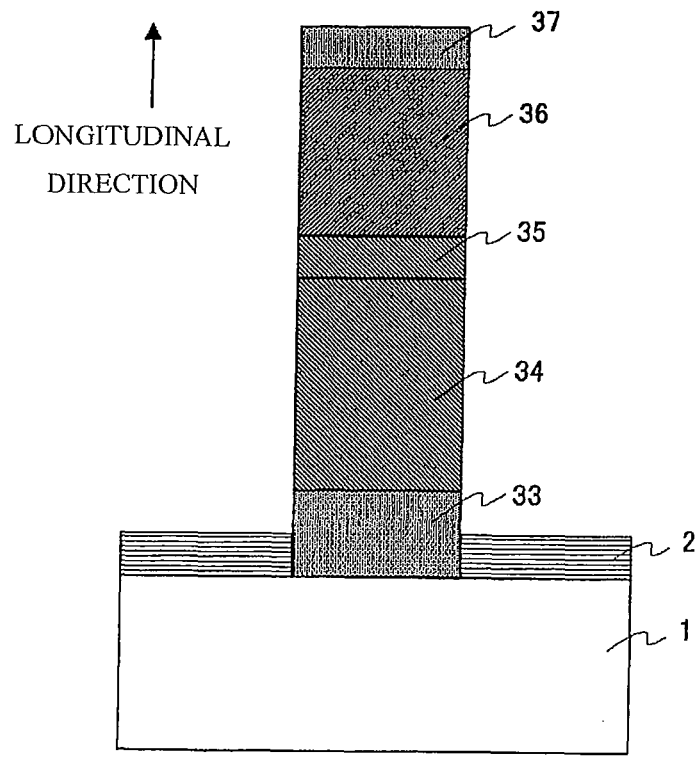
Figure 15:
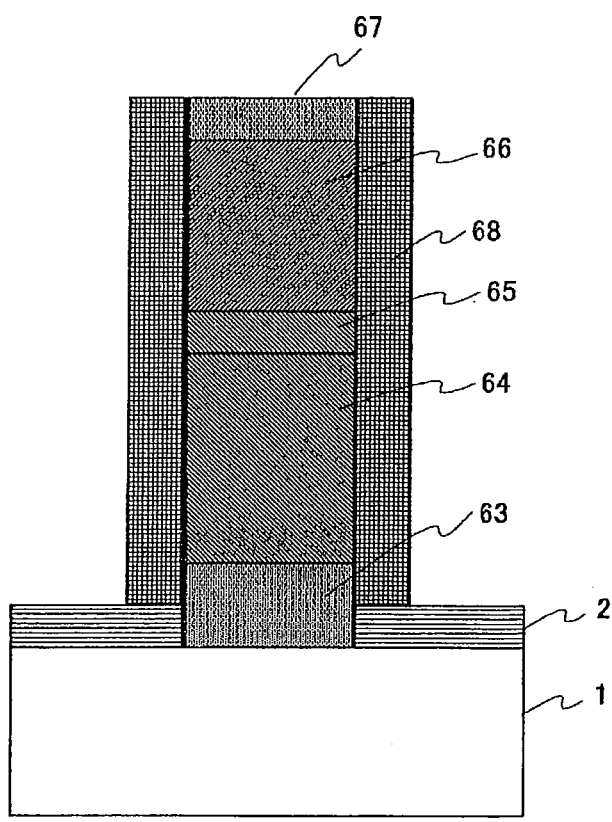
FIG. 15 is an example of the semiconductor rod having the quantum well layer made of an InGaAsP layer.
Figure 16:
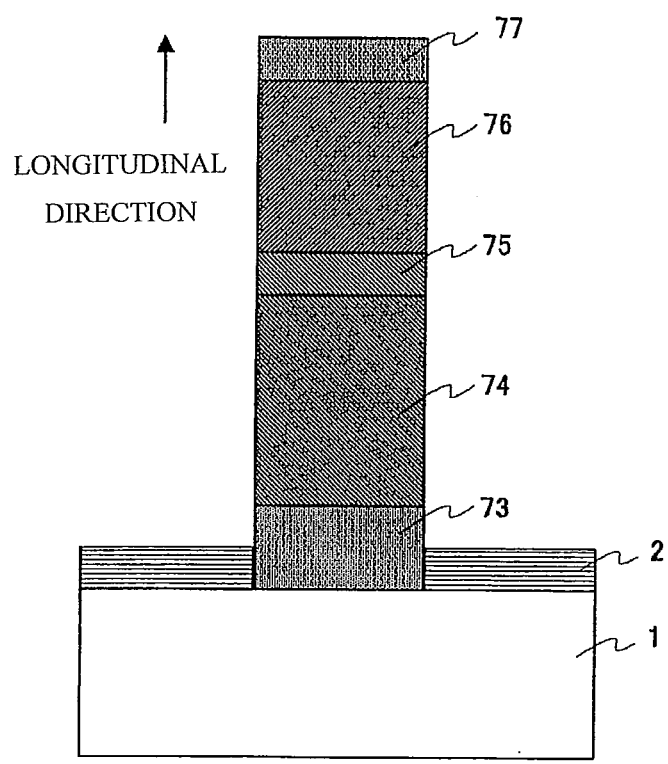
FIG. 16 is an example of the semiconductor rod having the quantum well layer made of an InGaN layer.

Further, the p-type region and the n-type region, as well as the quantum well layer of the semiconductor rods according to the present invention may have a multilayered structure (see FIGS. 11, 15, and 16). The term "multilayered structure" means that two or more layers of dissimilar semiconductor components are repeatedly laminated. For example, the barrier layers (34 and 36) shown in FIG. 11 are formed by alternately laminating a GaAs layer and an Al GaAs layer repeatedly.

If the p-type region, the n-type region, or the quantum well layer of the semiconductor rods has the multilayered structure, the light emission intensity may be enhanced by matching the cycle period of the layer with the wavelength of the emitted light.

The semiconductor rods may be formed by MOCVD, and also by molecular beam epitaxy which makes use of vapor deposition of elements in a vacuum device. Manufacture of the semiconductor rods will be described later.

The semiconductor light-emitting element array according to the present invention is characterized in that the length of the semiconductor rods varies among regions. As mentioned above, the semiconductor rods are formed by MOCVD or the like, and the growing speed of the semiconductor crystal changes depending on the area of the openings formed in the insulating film or the density of the openings. Thus, by adjusting the area and/or arrangement of the openings, the height of the semiconductor rods can be controlled.

The semiconductor rods have p-n junctions and emit light upon receiving the electric current. The emitted light has various wavelengths corresponding to the semiconductor materials which form the semiconductor rods. The present invention mainly describes the semiconductor rods having the quantum well structure. In the quantum well structure, the wavelength of the emitted light depends on the thickness of the quantum well layer. Thus, the wavelengths of light emitted from the semiconductor rods differ among the regions of the insulating film.

The semiconductor light-emitting array according to the present invention includes a first electrode connected to the substrate, and a second electrode connected to the tip end (i.e. the opposite side of the substrate). The first and second electrodes are formed by the combination, e.g., of the p-type electrode (such as Cr/Au or InSn oxides) and the n-type electrode (such as AuGeNi).

One or more first electrodes may be provided on the semiconductor crystal substrate including two or more regions. One or more second electrodes may be provided for each region (i.e., for each light-emitting element). Either the first or the second electrode may be arbitrary selected to make the p-type electrode or the n-type electrode corresponding to the arrangement of the p-type region and the n-type region.

When the electric current is turned on and passed through the p-n junction in a forward direction, light is emitted from the p-type electrode, and the emitted light can be extracted from the side of the p-type electrode. Preferably, the p-type electrode is formed as a transparent electrode or has a patterned structure so as to facilitate retrieval of light emitted perpendicularly to the surface of the substrate. It is also possible to extract light from the side of the n-type electrode. In this case, the n-type electrode is formed by a transparent electrode. As such, it is preferable that the electrode disposed on the side where the light is extracted is formed by a transparent electrode.

The circumference around the semiconductor rods included in the semiconductor light-emitting element array of the present invention may be covered by a protective layer. The protective layer may be a crystalline layer which is grown laterally, given that the extending direction of the rods is a longitudinal direction (see FIG. 4), or may be a separately added high-resistance material (see FIG. 5). In addition, the gap between the semiconductor rods may be filled with an insulating material (FIG. 5).

Light Emission Property:

The wavelength of light from the semiconductor light-emitting element array according to the present invention may be changed depending on various factors, such as semiconductor components of the semiconductor rods, or the height of the semiconductor rods (and especially the thickness of the quantum well layer if the quantum well rod structure is formed).

For example, if the quantum well layer is made of GaAs, it is possible to emit light having a wavelength of about 700 nm to 900 nm (see FIG. 7) depending on the thickness of the quantum well layer. If the quantum well layer is made of InGaAs or InGaAsP, the light having a wavelength of about 1.3 μm to 1.5 μm can be generated depending on the atomic ratio of In to Ga in the quantum well layer. If the quantum well layer is made of, e.g., InGaN, light having a wavelength of about 400 nm to 700 nm can be generated depending on the atomic ratio of In to Ga (see FIG. 17).

The intensity of light emission is also influenced, e.g., by the laminated structure of the p-type region, the n-type region, or the quantum well layer.

2. Manufacturing Method of Semiconductor Light-Emitting Element Array

A semiconductor light-emitting element array according to the present invention may be manufactured by any method so long as it does not hamper the advantages of the present invention, and may be manufactured by a method described below including the following process steps.

A semiconductor crystal substrate is prepared and the surface of its crystal axis (111) is covered by an insulating film. The insulating film may be formed on the surface of the substrate by sputtering or the like. Openings are formed in the insulating film covering the surface of the semiconductor crystal substrate. The openings may be formed in the insulating film by photolithography or electron-beam lithography.

Preferably, the insulating film is divided into two or more regions, and each region has the same opening area or density as the openings formed within the region. On the other hand, it is preferable to change the opening area or density of the openings for each region. As mentioned above, the opening area or density of the openings may influence the length of the semiconductor rods to be formed. By setting the size and arrangement of the openings in each region appropriately corresponding to a desired semiconductor rod, the light emitted from the semiconductor rods formed in each region may have different wavelengths. As a result, the semiconductor light-emitting element array that emits multicolored light according to the present invention can be provided.

Then, the semiconductor rods are formed through the openings by crystal growth from the semiconductor crystal substrate covered by the insulating film having the openings. For example, various methods are known for growing the semiconductor crystals by metal organic chemical vapor deposition (MOCVD), and any method may be used as desired. The semiconductor crystal substrate is disposed in a reactor and heated to about 400° C. to 900° C., and a material gas, such as an organic metal material gas, is supplied to the reactor to form semiconductor rods.

For example, if it is desired to grow GaAs, a trimethylgallium gas is used as a material gas of Ga and an arsine gas is used as a material gas of As. When AlGaAs is grown, a trimethylgallium gas is used as a material gas of Ga, an arsine gas is used as a material gas of As, and trimethylaluminum is used as an aluminum source.

Forming the semiconductor rod by crystal growth includes the steps of forming a p-type semiconductor layer and an n-type semiconductor layer. Specifically, the semiconductor rod includes the p-type and n-type semiconductors, and has a p-n junction. It may be the case that the p-type semiconductor layer is formed after forming the n-type semiconductor layer, or the n-type semiconductor layer is formed after the p-type semiconductor layer.

Means for making the semiconductor layers of the p-type or the n-type may also be suitably selected and adopted. For example, if it is desired to grow an n-type GaAs, a $Si_2H_6$ gas may be supplied in addition to the organic metal material gas. Similarly, if a p-type GaAs is desired, dimethylzinc may be supplied in addition to the supply of the organic metal material gas.

Further, forming the semiconductor rod by crystal growth may include the step of forming a quantum well layer. Preferably, the quantum well layer is a non-doped type layer, and is neither the p-type layer nor the n-type layer. Because the potential of the quantum well layer needs to be lower than the potential of barrier layers which sandwich the quantum well layer, its material is different from the material of the barrier layers. Thus, in the step of forming the quantum well layer, a different organic metal material gas is supplied to the reactor.

The supplied organic metal material gas causes a vapor phase chemical deposition reaction on the surface of the substrate (the crystalline axis (111)) exposed through the opening, to thereby deposit desired crystals. At an early stage of the crystal growth process, when only a short period of time has elapsed for growth, deposited crystals are in the form of particles or in the hill shape, so that the rods have grown more in the lateral direction rather than in the height direction, and the rods are still short. In contrast, as the growth time elapses, the crystals gradually grow higher to form rod-shaped semiconductor crystals.

A vertical cross section of the semiconductor rod along the growing direction thereof may change depending on the shape of the opening. Namely, the semiconductor rod is shaped like a triangular prism when the opening is triangular, a hexagonal prism when the opening is hexagonal, and nearly a column-shaped polygonal prism when the opening is circular. The thickness of the semiconductor rod can also be adjusted generally by the diameter of the openings.

In addition, a crystal growth rate in the height direction varies depending on the area or arrangement of the openings. Namely, as the area of the opening becomes larger, the crystal growth rate in the height direction is slowed and the semiconductor rod is short, and if the quantum well layer is provided, the thickness of the well also becomes thinner. Similarly, as the density of the opening is decreased, the crystal growth rate in the height direction is slowed and the semiconductor rod is short, and if the quantum well layer is provided, the thickness of the well also becomes thinner.

As described above, the manufacturing method of the present invention divides the insulating film provided over a single substrate into several regions and forms openings having different opening areas or densities among the respective region. Although the semiconductor crystal is grown on the single substrate to form the semiconductor rods simultaneously, the obtained semiconductor rods have different light emission characteristics for each region, thereby providing a convenient way to fabricate the light-emitting element array capable of emitting multicolored light.

3. Optical Transmitter

An optical transmitter of the present invention includes a semiconductor light-emitting array and an optical waveguide of the present invention. As mentioned above, the semiconductor light-emitting element array of the present invention includes a plurality of light-emitting elements which emit light of different wavelengths, and is useful in transmission systems, such as the parallel transmission system or the wavelength multiplexing transmission system.

A first embodiment of the optical transmitter includes an optical waveguide, provided in respective light-emitting element regions of the semiconductor light-emitting element array. Preferably, in each region, the area of the region where the semiconductor rods are formed is equal to or somewhat smaller than the size of the core of the corresponding optical waveguide. The optical transmitter shown in FIG. 18 may be used in the parallel transmission system.

Figure 19A:
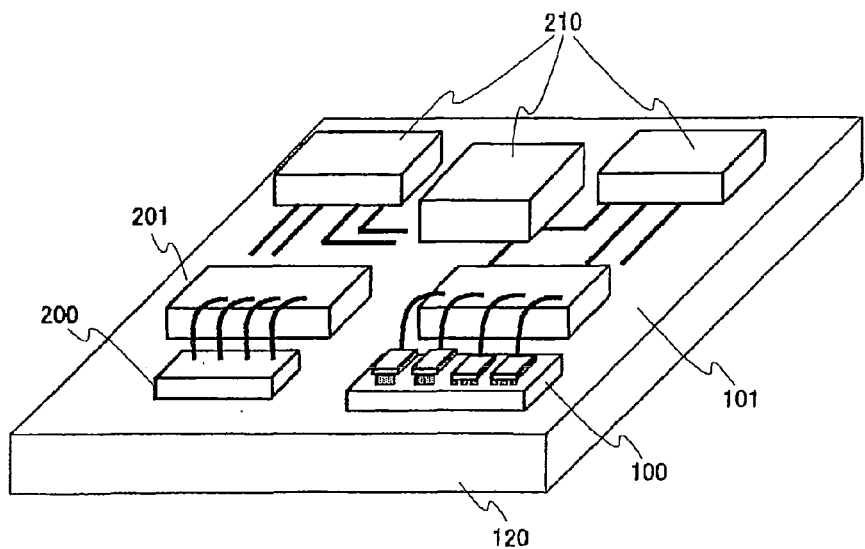
FIG. 19 shows an optical signal transmitting and receiving device.
Figure 19B:
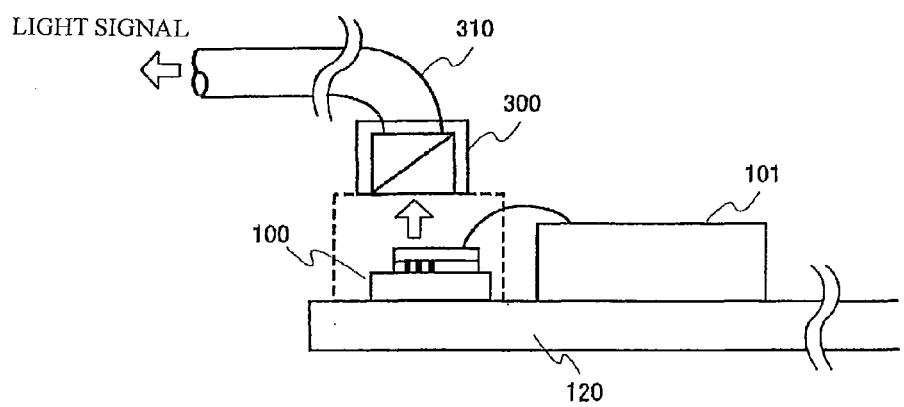

A second embodiment of the optical transmitter, as shown in FIG. 19B, multiplexes light beams from the light-emitting elements of the semiconductor light-emitting element array, and transmits the multiplexed light through the optical waveguide by the wavelength multiplexing transmission system. The optical transmitter shown in FIG. 19 may be used in the wavelength multiplexing transmission system.

Figure 22:
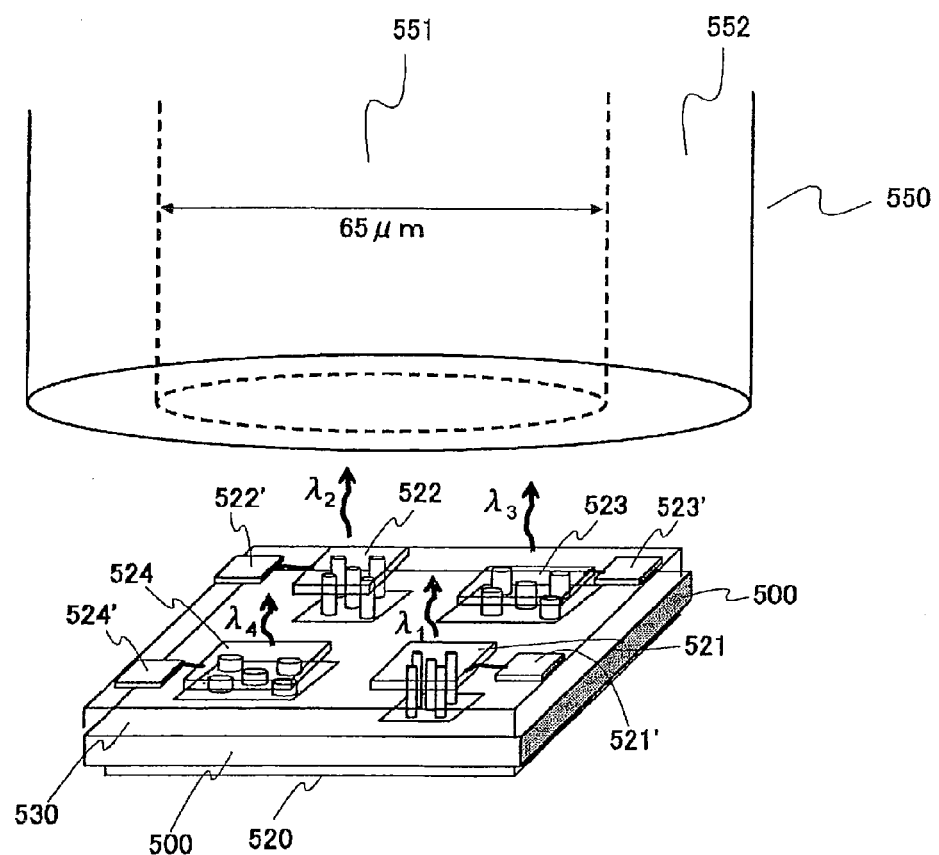
FIG. 22 shows a device for optical transmission (i.e., four-wave multiplexed communication) including the semiconductor light-emitting element array.

As shown in FIG. 22, it is also possible to provide a single optical waveguide (e.g., an optical fiber) which corresponds to the entire region of the light-emitting elements of the semiconductor light-emitting element array. As a result, four-wave multiplexed transmission is realized using a single optical fiber, even without an optical multiplexer. The wavelength interval of light emitted from the respective light-emitting regions can be adjusted to about 10 nm.

4. Illuminator

Figure 24:
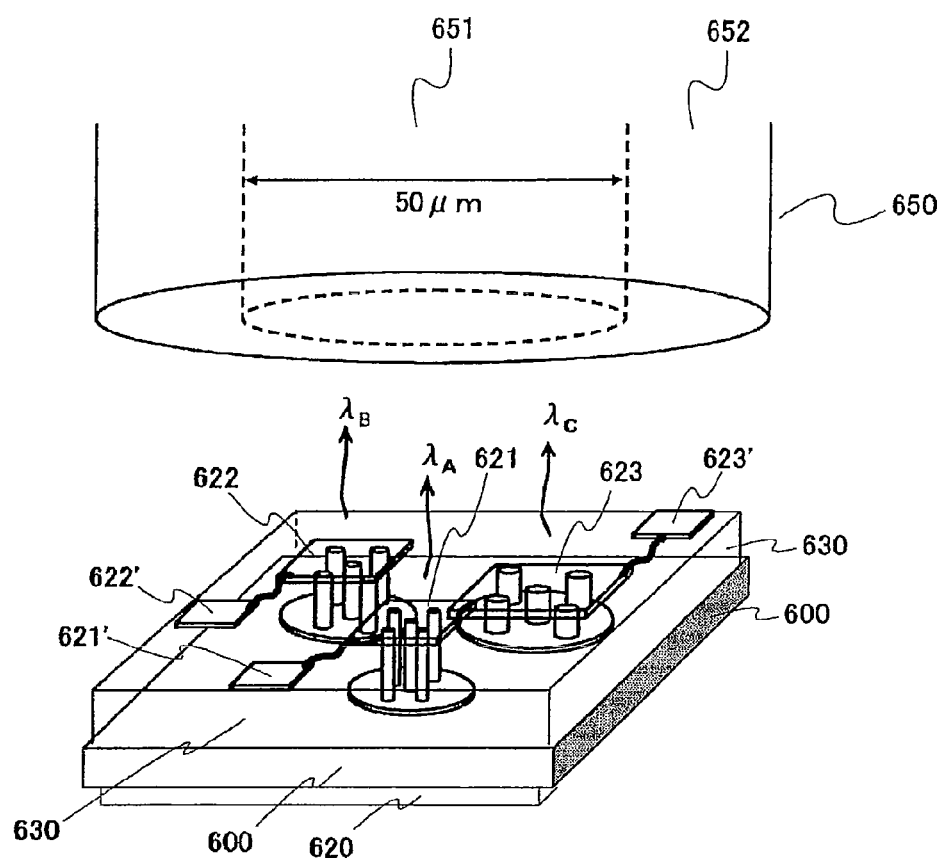
FIG. 24 is an illuminator including the semiconductor light-emitting element array.

An illuminator of the present invention includes the semiconductor light-emitting element array and an optical waveguide of the present invention. For example, as shown in FIG. 24, a semiconductor light-emitting element array including light-emitting elements for emitting blue, green, and red light, respectively, is combined with a single optical wavelength to guide white light. The illuminator of the present invention may be used as an illuminating fiber in medical devices and the like.

In the following, the semiconductor light-emitting element array according to the present invention will be described in more detail with reference to the attached drawings.

Embodiment 1

Adjusting the Density of Openings

FIG. 1A shows a semiconductor crystal substrate 1 (e.g., GaAs, InP, Si) covered by an insulating film 2. The surface of the substrate 1 covered by the insulating film 2 is a crystal axis (111) surface. For example, the thickness of the insulating film 2 is 20 nm. The insulating film 2 is divided into four regions consisting of insulating film portions 2A-2D.

The sizes (a×b) of the insulating film portions 2A-2D may be the same, or may be dissimilar. No particular limitations are imposed on longitudinal and lateral lengths a, b, and in this description both lengths are set to 100 μm. Also, the center-to-center distance between respective portions (i.e., center-to-center distances c1, c2, and c3 between insulating film portions 2A and 2B, 2B and 2C, and 2C and 2D, respectively) is set to 250 μm.

Figure 1B:
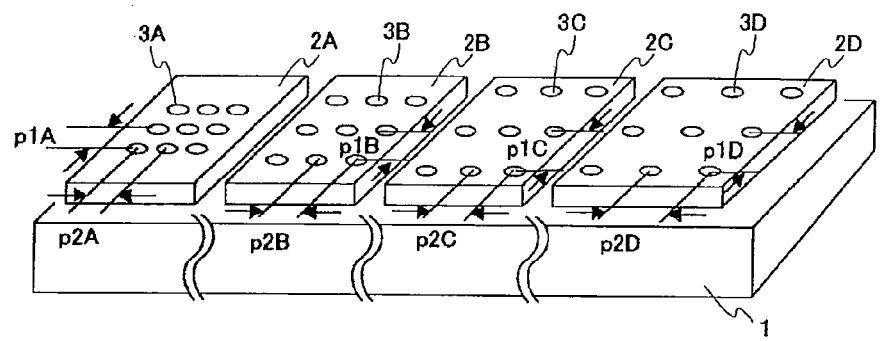
FIG. 1B shows openings formed in the insulating film.

FIG. 1B shows two or more openings (nine openings are shown) 3A-3D formed in each of the insulating film portions 2A-2D. The surface of the substrate 1 is exposed by the openings 3A-3D. The openings 3A-3D are formed by micro pattern forming technologies used in the semiconductor manufacturing process, such as photolithography, electron-beam lithography, and the like. No particular limitations are imposed on the shapes of the openings 3A-3D, and the shapes may be rectangular, triangular, hexagonal, circular, etc.

The opening area of the openings 3A-3D may have the diameter of 100 nm to 500 nm. In FIG. 1B, all the openings 3A-3D have the same opening area. In the description below, the diameter of the openings 3A-3D is 80 nm.

The openings 3A formed in the insulating film portion 2A have an approximately constant spacing from each other (assuming that a longitudinal spacing is p1A, and a lateral spacing is p2A). Similarly, the spacings (p1B and p2B) between the openings 3B formed in the insulating film portion 2B, the spacings (p1C and p2C) between the openings 3C formed in the insulating film portion 2C, and the spacings (p1D and p2D) between the openings 3D formed in the insulating film portion 2D are also approximately constant. The spacing between the openings may be adjusted within the range of a few tens of nm to a few μm. In FIG. 1B, the longitudinal distance p1 and the lateral distance p2 are approximately the same, but p1 and p2 may be dissimilar.

In FIG. 1B, the spacing between the openings is different for each of the insulating film portions 2A-2D. Namely, the spacing between the openings 3B in the insulating film portion 2B is larger than the spacing between the openings 3A in the insulating film portion 2A. Similarly, the spacing between the openings 3C in the insulating film portion 2C is larger than the spacing between the openings 3B in the insulating film portion 2B, and the spacing between the openings 3D in the insulating film portion 2D is larger than the spacing between the openings 3C in the insulating film portion 2C.

In particular, it is assumed that p1A=p2A=0.3 μm, p1B=p2B=1.5 μm, p1C=p2C=2.3 μm, and p1D=p2D=3.0 μm.

Figure 1C:
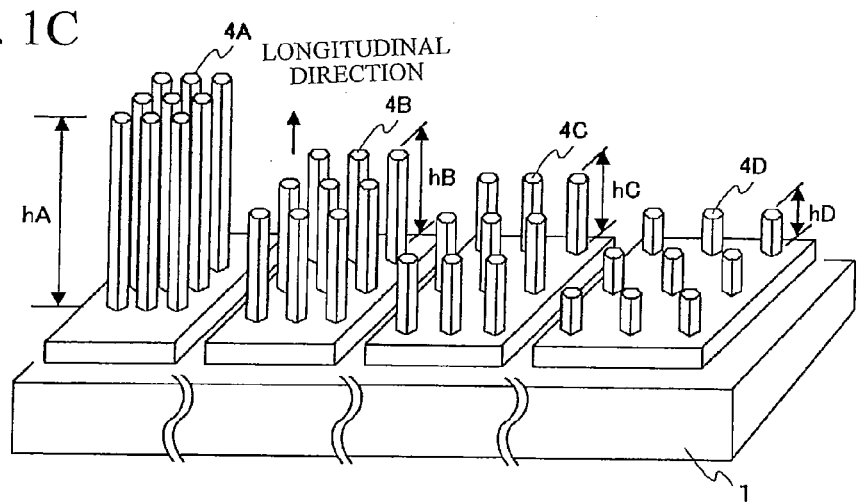
FIG. 1C shows resulting semiconductor rods.

FIG. 1C shows semiconductor rods 4A-4D formed in the structure shown in FIG. 1B. The semiconductor rods 4A-4D are formed by means of metal organic chemical vapor deposition, or a like method.

In particular, a trimethylgallium (TMG) gas and an arsine (AsH$_3$) gas are used as material gases of Gs and As to grow GaAs crystal. Also, a trimethylaluminum (TMA) gas is used as a material of Al to grow AlGaAs. These material gases are supplied for a predetermined period of time over the surface of the substrate 1 which is heated and maintained at about 750° C.

Figure 2A:
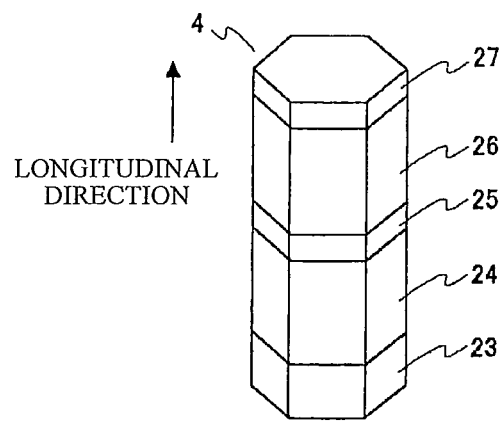
FIG. 2 is a schematic view showing respective layers of the resulting semiconductor rod.
Figure 2B:
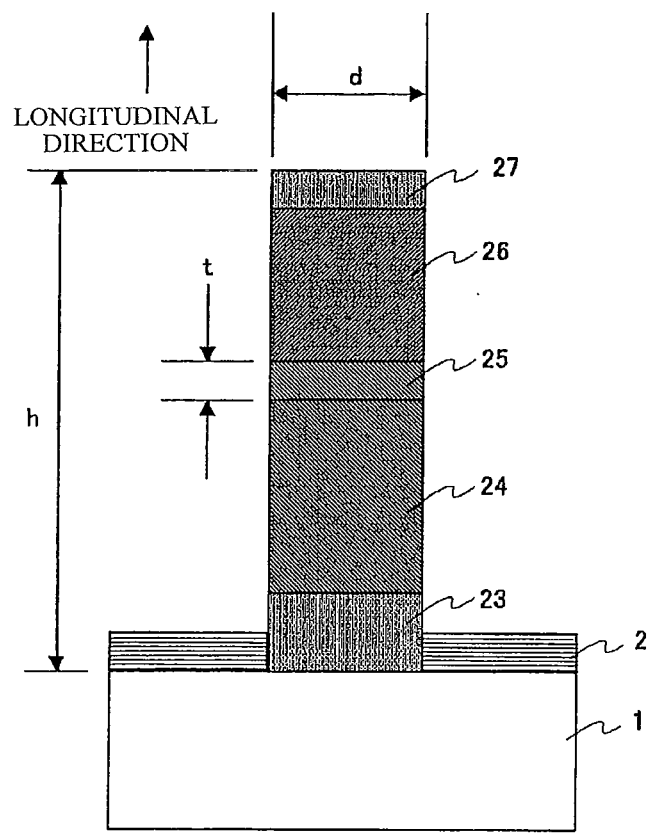

FIG. 2 is a schematic view showing an exemplary semiconductor rod 4 formed as above. The semiconductor rod 4 shown in FIG. 2 is formed during one crystal growing cycle which includes the steps of:

1) forming an n-type GaAs layer 23 on the substrate 1 by supplying TMG at a pressure of $2.7 \times 10^{-7}$ atm, and AsH$_3$ at a pressure of $5.0 \times 10^{-4}$ atm, and also supplying Si$_2$H$_6$ at a supply rate of 1 sccm (cc per second);

2) laminating an n-type AlGaAs layer 24 over the n-type GaAs layer 23 by supplying TMG at a pressure of $2.7 \times 10^{-7}$ atm, TMA at a pressure of $3.5 \times 10^{-8}$, and AsH$_3$ at a pressure of $5.0 \times 10^{-4}$ atm, and also supplying Si$_2$H$_6$ at a supply rate of 1 sccm (cc per second);

3) laminating a GaAs layer 25 over the n-type AlGaAs layer 24 by supplying TMG at a pressure of $2.7 \times 10^{-7}$ atm and AsH$_3$ at a pressure of $5.0 \times 10^{-4}$ atm;

4) laminating a p-type AlGaAs layer 26 over the GaAs layer 25 by supplying TMG at a pressure of $2.7 \times 10^{-7}$ atm, TMA at a pressure of $3.5 \times 10^{-8}$ atm, and AsH$_3$ at a pressure of $5.0 \times 10^{-4}$ atm, and also supplying dimethylzinc at a supply rate of 0.5 sccm; and 5) laminating a p-type GaAs layer 27 over the p-type AlGaAs layer 26 by supplying TMG at a pressure of $2.7 \times 10^{-7}$ atm, AsH$_3$ at a pressure of $5.0 \times 10^{-4}$ atm, and also supplying dimethylzinc at a supply rate of 0.5 sccm (cc per second).

Thus, the n-type GaAs layer 23/the n-type AlGaAs layer 24/the GaAs layer 25/the p-type AlGaAs layer 26/the p-type GaAs layer 27 are formed in one semiconductor rod, while the GaAs layer 25 used as a quantum well layer is sandwiched by the p-type AlGaAs layer 26 and the n-type AlGaAs layer 24 (the quantum well structure). It is noted that the p-n junction structure of the semiconductor rod shown in FIG. 2 is accomplished by growing the p-type semiconductor layer following the growth of the n-type semiconductor layer. It is also possible to provide the semiconductor rod having the p-n junction structure by growing the n-type semiconductor layer following the growth of the p-type semiconductor layer.

Although the openings formed in FIG. 1B have an approximately constant opening area, the density of the openings differs among the insulating film portions 2A-2D, as the spacing (p1 or p2) between the openings varies among the insulating film portions 2A-2D. As a result, the semiconductor rods have approximately the same thickness (diameter), but the height h differs among the insulating film portions 2A-2D. In particular, the insulating film portion 2A has a narrow spacing (p1A and p2A) between the openings and the density of openings is high, so that a height hA of the semiconductor rods 4A formed therein is tall. As the spacing between the openings becomes longer in the insulating film portions B, C, and D in this order, the semiconductor rod becomes shorter (hB>hC>hD). In other words, it might be said that the spacing between the openings is inversely proportional to the height of the semiconductor rods.

In particular, a height hA=1 µm for the semiconductor rods 4A formed in the insulating film portion 2A, a height hB=0.5 µm for the semiconductor rods 4B formed in the insulating film portion 2B, a height hC=0.3 µm for the semiconductor rods 4C formed in the insulating film portion 2C, and a height hD=0.2 µm for the semiconductor rod 4D formed in the insulating film portion 2D.

As to the quantum well structure (the p-type AlGaAs layer 26/the GaAs layer 25/the n-type AlGaAs layer 24) formed in each of the semiconductor rods 4A-4D shown in FIG. 1C, the quantum well layer 25 (GaAs) of the semiconductor rods 4A of the insulating film portion 2A has the largest thickness, and the thickness of the quantum well layer 25 becomes thinner for the semiconductor rods 4B, 4C, and 4D of the insulating film portions 2B, 2C, and 2D, in this order.

In particular, the thickness of the quantum well layer 25 of the semiconductor rods 4A of the insulating film portion 2A is 10 nm, the thickness of the quantum well layer 25 of the semiconductor rods 4B of the insulating film portion 2B is 5 nm, the thickness of the quantum well layer 25 of the semiconductor rods 4C of the insulating film portion 2C is 4 nm, and the thickness of the quantum well layer 25 of the semiconductor rods 4D of the insulating film portion 2D is 2.5 nm.

Figure 3:
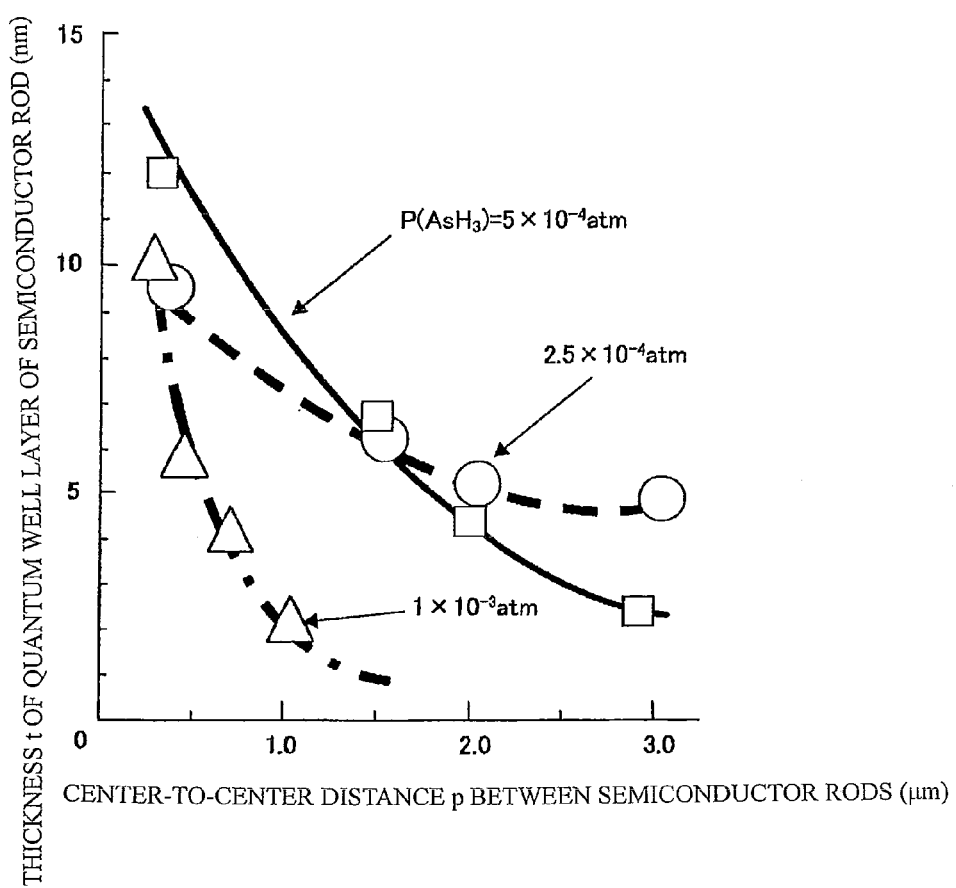
FIG. 3 is a graph showing the thickness of a quantum well layer of the semiconductor rod relative to the spacing between the semiconductor rods.

FIG. 3 is a graph plotting the thickness (t) of the quantum well layer 25 of the semiconductor rods 4A-4D relative to the center-to-center distance (p) of the openings 3A-3D formed in the insulating film. In the graph of FIG. 3, three curves ($5 \times 10^{-4}$ atm, $2.5 \times 10^{-4}$ atm, and $1 \times 10^{-3}$ atm) of different arsine supply pressures are plotted. As can be seen from FIG. 3, the quantum well layer becomes thicker as the center-to-center distance of the openings is shorter, irrespective of the arsine supply.

Figure 4:
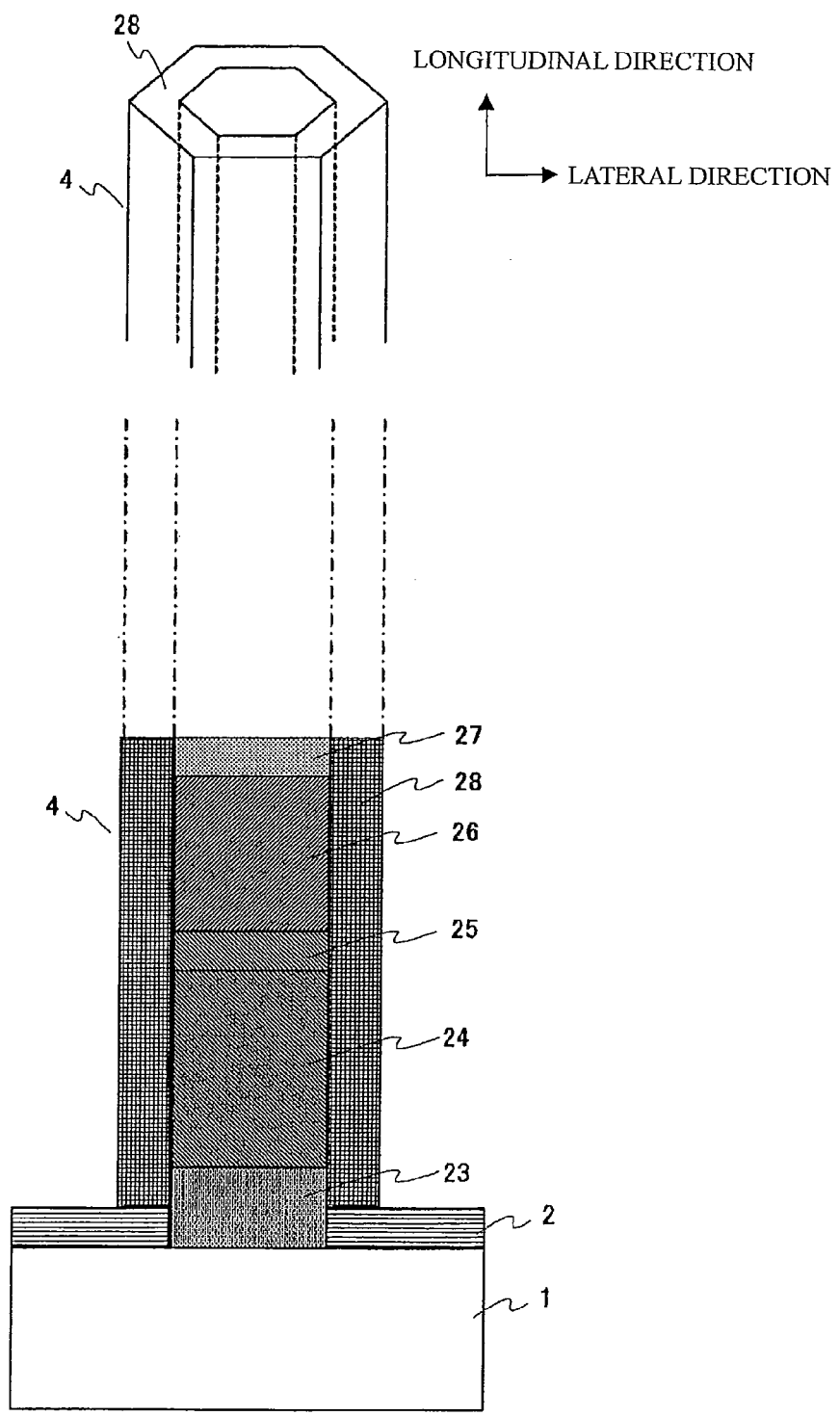
FIG. 4 shows a semiconductor rod covered by AlGaAs.
Figure 5:
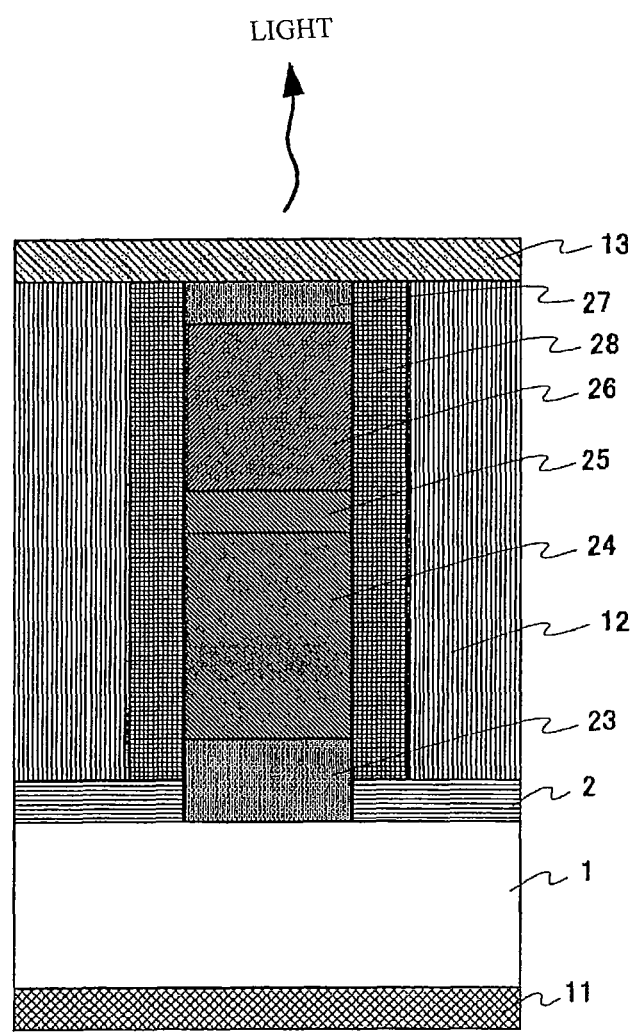
FIG. 5 shows a semiconductor rod with the spacing between the rods filled with an insulating material, and having n-type and p-type electrodes disposed therein.

As shown in FIG. 4, the circumference around the semiconductor rod 4 may be covered. In FIG. 4, the semiconductor rod 4 is covered almost concentrically by a film 28 formed by laterally grown AlGaAs. To laterally grow the AlGaAs film 28, a growth temperature is maintained in the range of 650° C. to 750° C., while the supply pressure of arsine is maintained at a high pressure (approximately $5 \times 10^{-4}$ atm to $1 \times 10^{-3}$ atm).

Also, as shown in FIG. 5, a gap between the semiconductor rods 4 formed on the substrate 1 may be filled with an insulating material 12, such as silicone oxide. As shown in FIG. 5, a p-type electrode 13 is formed on the tip end (over the p-type GaAs layer 27) of the semiconductor rod 4. The p-type electrode 13 has a patterned structure so as to facilitate retrieval of light from the semiconductor rod 4, and is formed as a transparent electrode. For example, the p-type electrode 13 is formed by an Cr/Au laminated electrode, or by InSn oxides. Meanwhile, an n-type electrode 11 is formed on the back side of the substrate 1. The n-type electrode 11 may be made of a material, such as AuGeNi. As a result, the semiconductor light-emitting element array of the present invention is provided.

Figure 6:
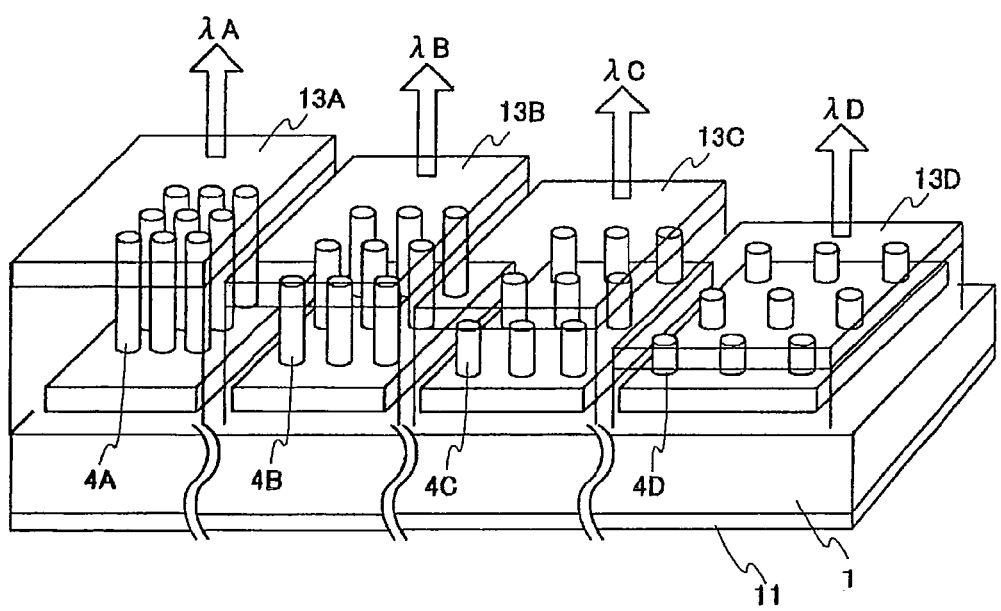
FIG. 6 is a perspective view of the semiconductor light-emitting element array of Embodiment 1.

FIG. 6 is a perspective view of the semiconductor light-emitting element array according to the present invention. The semiconductor rods 4A-4D formed in the respective insulating film portions 2A-2D have different heights, and the quantum wells layer formed therein also have different thicknesses. The n-type electrode 11 is formed on the substrate 1 and the p-type electrodes 13A-13D are formed in respective semiconductor rods 4A-4D.

A potential difference is provided between the n-type electrode 11 and the p-type electrodes 13A-13D and electric current is turned on to the p-n junction in a forward direction. In response to this, light emission is confirmed from each of the side of the p-type electrodes 13A-13D of the semiconductor rods 4A-4D. Light is emitted at 77K or 300K from respective semiconductor rods.

Figure 7:
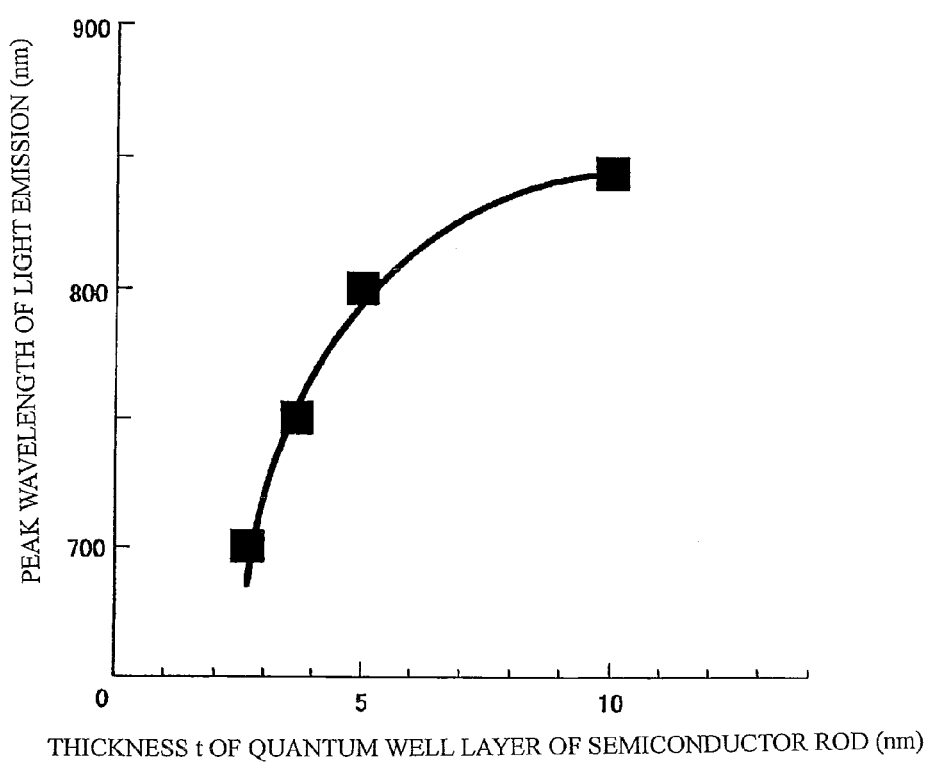
FIG. 7 is a graph showing the thickness of a quantum well layer of the semiconductor rod of each light-emitting element in the semiconductor light-emitting element array of Embodiment 1, relative to the peak wavelength of light emission.

FIG. 7 shows peak wavelengths of light emission when light is emitted at 300K. It is shown that the emitted light has longer wavelengths with increasing thickness t of the quantum well layer of the quantum well structure in the semiconductor rod.

Table 1 is a parameter list of the openings of the insulating film and the semiconductor rods of the semiconductor light-emitting element array obtained in the first embodiment (see FIG. 6) relative to the wavelengths of emitted light. As shown in Table 1, as the spacing between the openings formed in the insulating film is narrower (or the density of the openings is higher), both the height of the semiconductor rods and the thickness of the quantum well layer are increased. It is also shown that, as the spacing between the openings is wider, the emitted light has a longer peak wavelength at a given temperature.

TABLE 1

| Spacing Between Openings (µm) | Diameter of Opening (nm) | Height h of Rod (µm) | Thickness of Rod (nm) | Thickness of Well Layer (nm) | Peak Wavelength of Emitted Light at 77K | Peak Wavelength of Emitted Light at 300K |
|---|---|---|---|---|---|---|
| 0.3 | 80 | 1.0 | 80 | 10 | 800 nm | 842 nm |
| 1.5 | 80 | 0.5 | 80 | 5 | 760 nm | 800 nm |
| 2.0 | 80 | 0.3 | 80 | 4 | 730 nm | 750 nm |
| 3.0 | 80 | 0.2 | 80 | 2.5 | 680 nm | 700 nm |

Embodiment 2

Adjusting the Opening Area of the Openings

Figure 8A:
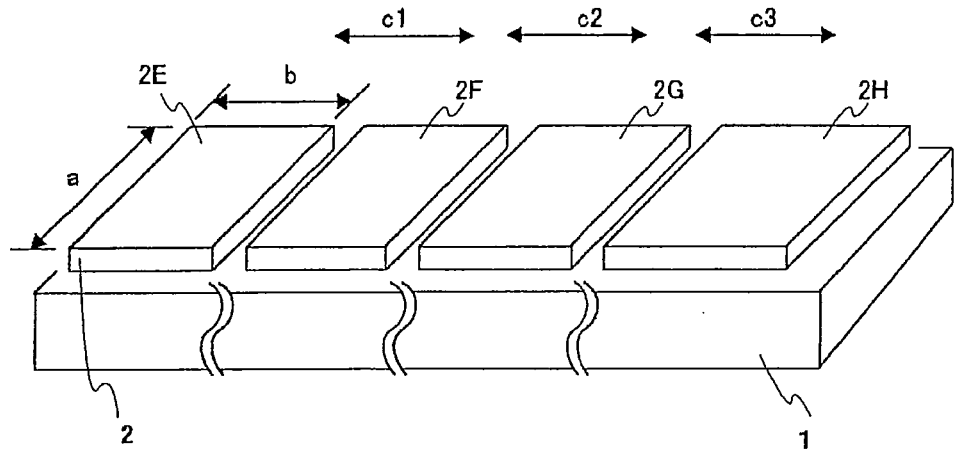
FIG. 8A shows a substrate covered by an insulating film.

Similar to FIG. 1A, FIG. 8A shows the crystal axis (111) surface of the semiconductor crystal substrate 1 covered by the insulating film 2, wherein the insulating film 2 is divided into insulating film portions 2E-2H. The thickness of the insulating film 2 and the size of the insulating film portions 2E-2H may be the same as those in FIG. 1A.

Figure 8B:
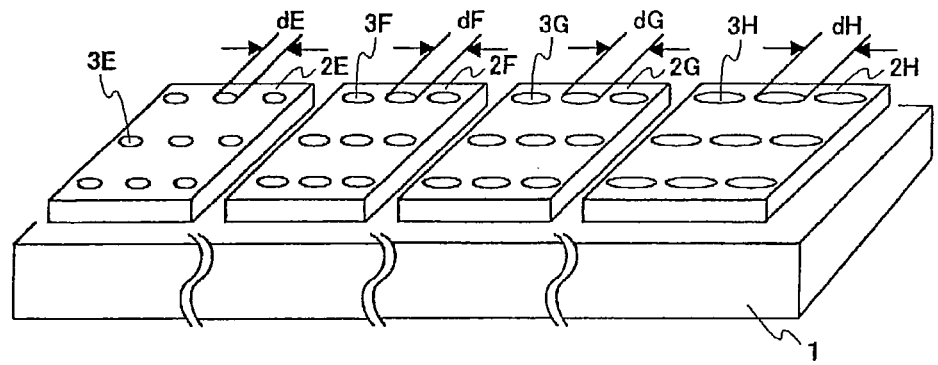
FIG. 8B shows openings formed in the insulating film.

FIG. 8B shows nine openings 3E-3H formed in each of the insulating film portions 2E-2H. It is assumed that the insulating film portions 2E-2H have the same center-to-center distance of the openings. In contrast, the opening area (or the diameter dE-dH of the openings 3) differs among the respective insulating film portions 2E-2H. Namely, the openings 3E formed in the insulating film portion 2E have a small area, and the opening area becomes larger for the openings 3F formed in the insulating film portion 2F, the openings 3G formed in the insulating film portion 2G, and the openings 3H formed in the insulating film portion 2H in this order.

In particular, it is assumed that the diameter dE of the openings 3E is 50 nm, the diameter dF of the openings 3F is 60 nm, the diameter dG of the openings 3G is 70 nm, and the diameter dH of the openings 3H is 100 nm.

Figure 8C:
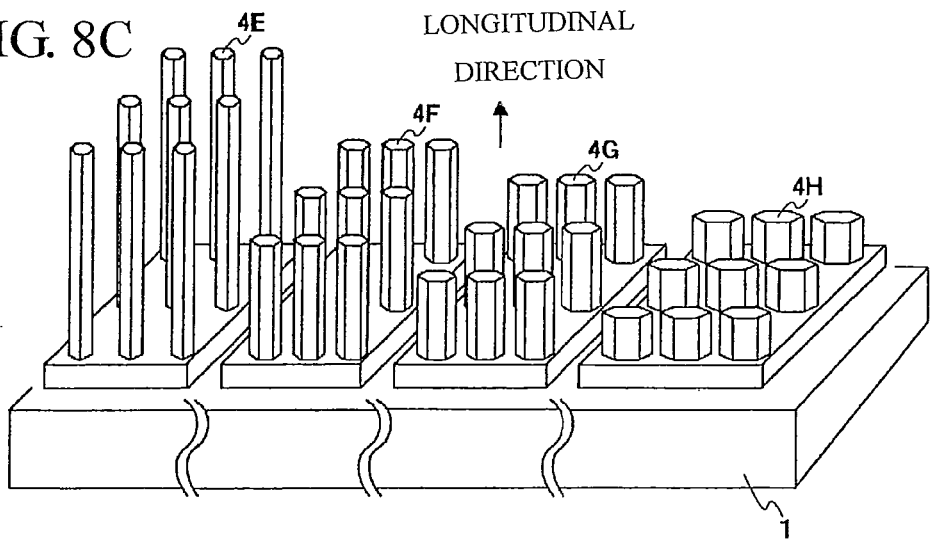
FIG. 8C shows resulting semiconductor rods.

FIG. 8C shows semiconductor rods 4E-4H formed on the substrate 1 shown in FIG. 8B. The semiconductor rods 4E-4H are formed by a similar method (e.g., MOCVD) under conditions similar to those of FIG. 1. Namely, each semiconductor rod has the n-type GaAs layer 23/the n-type AlGaAs layer 24/the GaAs layer 25/the p-type AlGaAs layer 26/the p-type GaAs layer 27, as shown in FIG. 2.

As shown in FIG. 8C, the semiconductor rods 4E of the insulating film portion 2E are the highest, and the height becomes lower for the semiconductor rods 4F of the insulating film portion 2F, the semiconductor rods 4G of the insulating film portion 2G, and the semiconductor rods 4H of the insulating film portion 2H, in this order. Thus, the smaller the area of the openings formed in the insulating film, the longer the semiconductor rods become.

Figure 9:
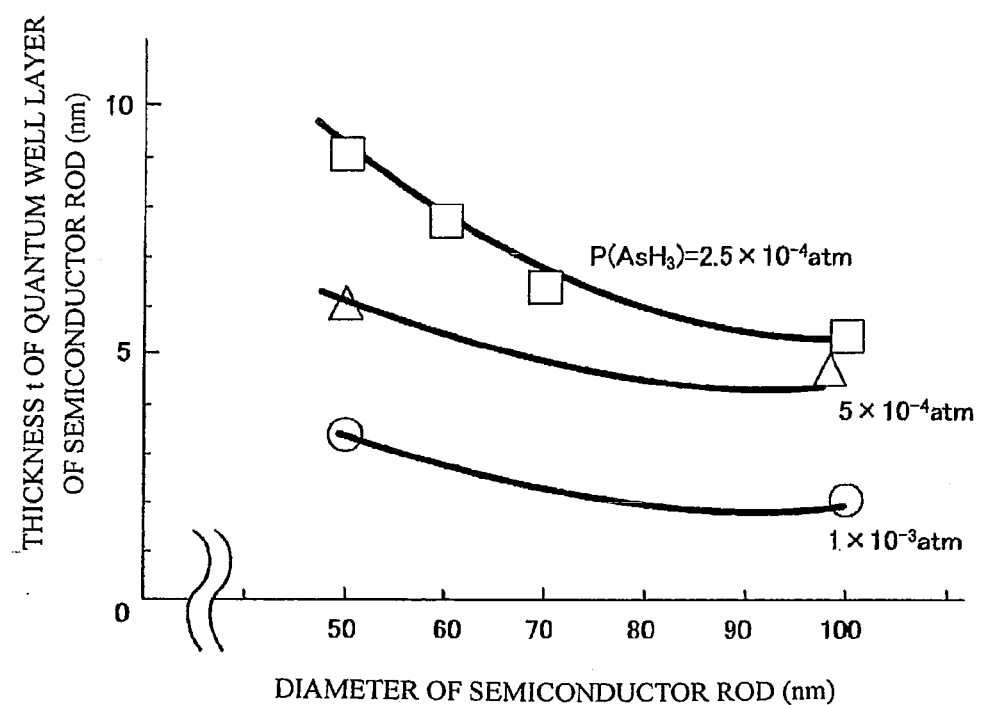
FIG. 9 is a graph showing the diameter of the quantum well layer of the resulting semiconductor rod relative to the thickness of the semiconductor rod.

FIG. 9 plots the diameter of the semiconductor rods 4E-4H (or the size of the openings 3E-3H formed in the insulating film) relative to the thickness t of the quantum well layers of the semiconductor rods 4E-4H. In the graph of FIG. 9, three curves are plotted, each curve representing a different arsine supply pressure ($5 \times 10^{-4}$ atm, $2.5 \times 10^{-4}$ atm and $1 \times 10^{-3}$ atm). As can be seen from FIG. 9, for the respective arsine supply amounts, the thickness t of the quantum well layer is increased as the diameter of the semiconductor rods (or the size of the openings) is reduced.

The semiconductor rods 4 are covered using the structure shown in FIG. 8C (see FIG. 4), the gaps between the semiconductor rods 4 are filled with the insulating film (see FIG. 5), and the p-type and n-type electrodes are formed (see FIG. 5). Consequently, the semiconductor light-emitting element array according to the present invention shown in FIG. 10 is realized.

Figure 10:
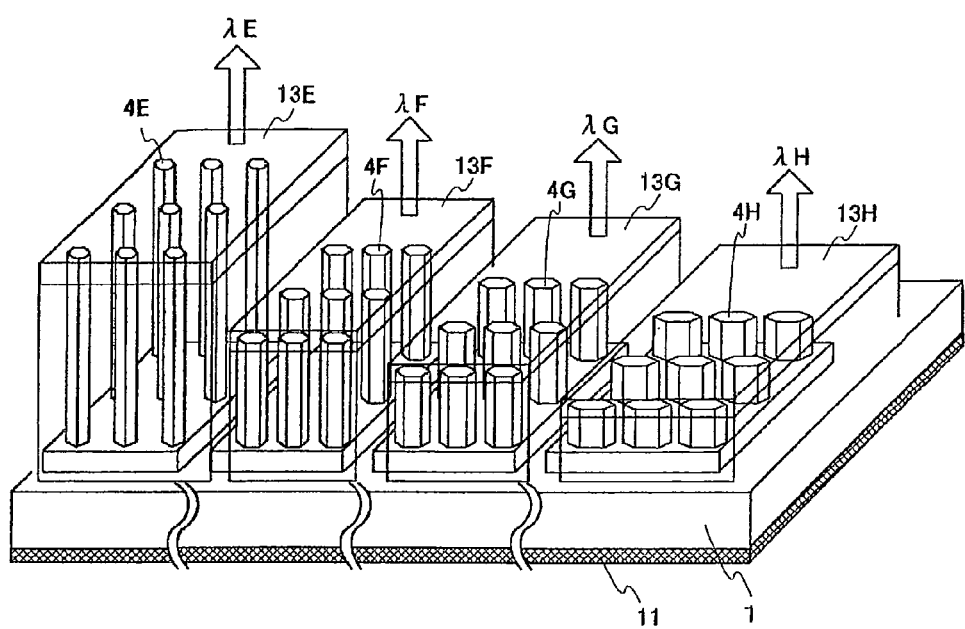
FIG. 10 is a schematic view of the semiconductor light-emitting array of Embodiment 2.

A potential difference is provided between the n-type electrode 11 and the p-type electrodes 13E-13H of the semiconductor light emitting array shown in FIG. 10, and electric current is turned on to the p-n junction in a forward direction. In response to this, light emission is confirmed from the side of the p-type electrodes 13E-13H of the semiconductor rods 4E-4H. Light is emitted at 77K or 300K from respective semiconductor rods. As the thickness t of the quantum well layer of the quantum well structure is increased, the light emission from the semiconductor rods has longer wavelengths.

As described in Embodiments 1 and 2, height control of the semiconductor rods can be carried out in response to the density (or the spacing between the openings) or the area of the openings formed in the insulating film, and the wavelengths of the emitted light can also be controlled.

Embodiment 3

Structure of the Semiconductor Rods

The semiconductor rod shown in FIG. 2 includes the n-type GaAs layer 23/the n-type AlGaAs layer 24/the GaAs layer 25/the p-type AlGaAs layer 26/the p-type GaAs layer 27, but the semiconductor components and/or the structure of the semiconductor rods are not limited thereto.

For example, another semiconductor rod having the quantum well structure is shown in FIG. 11. Namely, the semiconductor rod includes the quantum well layer unwed by a GaAs/AlGaAs layer 35, and barrier layers formed by an n-type GaAs/AlGaAs multilayer 34 and a p-type GaAs/AlGaAs multilayer 36. In addition, the quantum well structure is sandwiched by an n-type GaAs layer 33 and a p-type GaAs layer 37.

The barrier layers 34 and 36 have a multi-layered structure consisting of repeated lamination of the GaAs layer and the AlGaAs layer. Preferably, the cycle of the barrier layers 34 and 36, formed by the GaAs/AlGaAs layers, is the same as the wavelength of the light emission from the quantum well layer 35. The thickness of the layers in the direction of crystal growth can be controlled by adjusting the time taken for crystal growth. By providing such a multi-layered structure of the barrier layers 34 and 36, the intensity of emitted light can be increased.

Figure 12A:
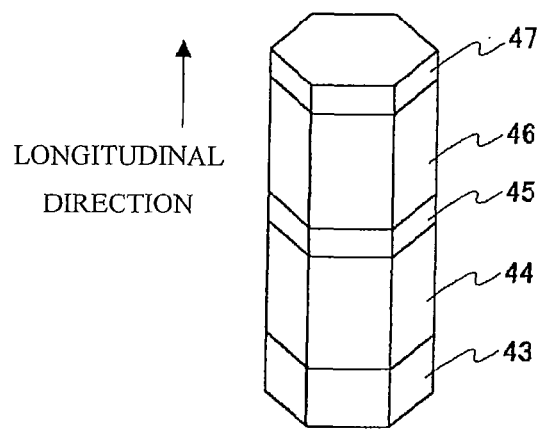
FIG. 12 is an example of the semiconductor rod having the quantum well rod made of an InGaAs layer.
Figure 12B:
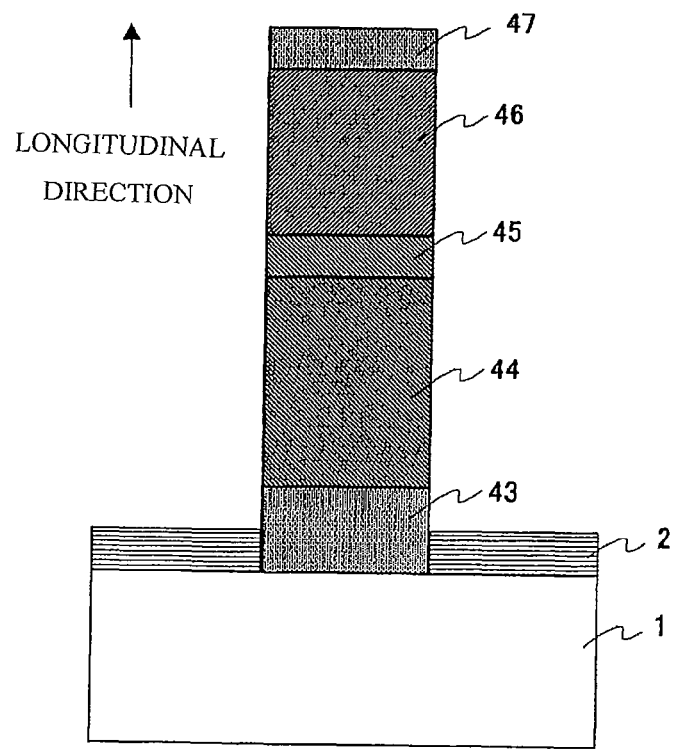

FIG. 12 shows another example of the semiconductor rod having the quantum well structure. Namely, the semiconductor rod includes the quantum well layer formed by an InGaAs layer 45, and barrier layers formed by n-type and p-type GaAs layers 44, 46 which sandwich the quantum well layer. Further, the quantum well structure is sandwiched by n-type and p-type GaAs layers 43, 47.

Figure 13A:
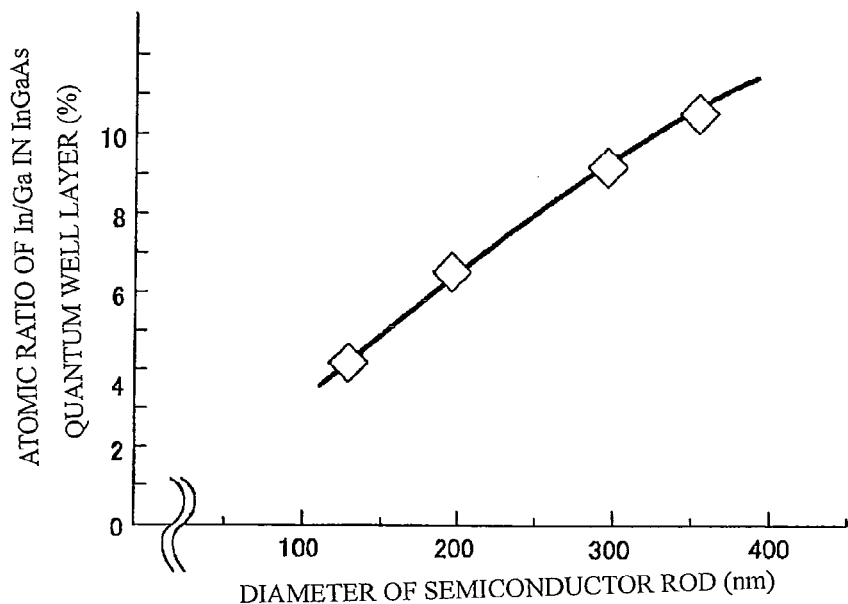
FIG. 13A is a graph showing the diameter of the semiconductor rod shown in FIG. 12 relative to the In/Ga atomic ratio in the quantum well rod.

FIG. 13A is a graph showing the diameter of the semiconductor rods relative to the atomic ratio of In to Ga (i.e., In atoms/Ga atoms) included in the InGaAs layer 45 which is the quantum well layer in the semiconductor rods. As shown in FIG. 13A, the ratio is raised as semiconductor rods become thicker.

Figure 13B:
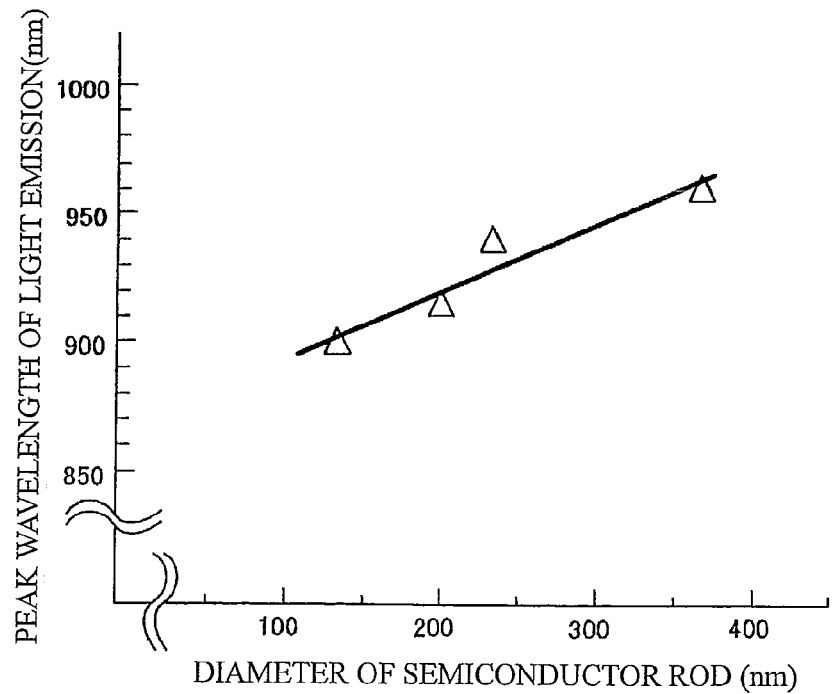
FIG. 13B is a graph showing the diameter of the semiconductor rod relative to the peak wavelength of light emission.

In addition, FIG. 13B plots the diameter of the semiconductor rod shown in FIG. 12 relative to the wavelengths of light emission. As shown in FIG. 13B, as the semiconductor rod becomes thicker, the peak wavelengths of the light emission shift to longer wavelengths.

As can be seen from FIGS. 13A and 13B, the light emission characteristics of the quantum well layer 45 is changed, and the wavelength of light is therefore changed corresponding to the thickness of the semiconductor rods. The wavelength of light from the semiconductor rod shown in FIG. 12 can be controlled corresponding to the area of the openings formed in the insulating film (see FIGS. 1B and 8B).

Figure 14:
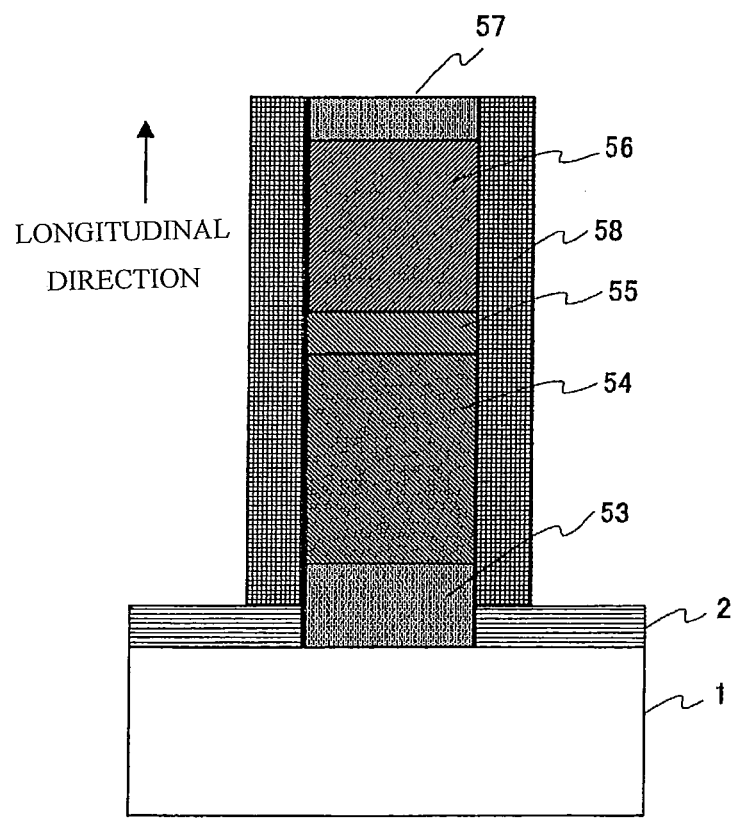
FIG. 14 is an example of the semiconductor rod having the quantum well layer made of an InGaAs layer.

FIG. 14 shows another example of the semiconductor rod having the quantum well structure. Namely, the semiconductor rod includes the quantum well layer formed by an InGaAs layer 55, and the barrier layers formed by an n-type InGaAsP layer 54 and a p-type InGaAsP layer 56 which sandwich the quantum well layer. Further, the quantum well structure is sandwiched by an n-type InP layer 53 and a p-type InP layer 57. Also, the circumference around the semiconductor rod is covered by a high resistance InP layer 58.

FIG. 15 shows another example of the semiconductor rod having the quantum well structure. Namely, the semiconductor rod includes the quantum well layer formed by an InGaAsP layer 65, and the barrier layers formed by an n-type InGaAsP/InP multilayer 64 and a p-type InGaAsP/InP multilayer 66 which sandwich the quantum well layer. The barrier layers 64, 66 have a multilayered structure formed by repeated lamination of the InGaAsP layer and the InP layer. The quantum well structure is sandwiched by an n-type InP layer 63 and a p-type InP layer 67.

The cycle of the barrier layers 64, 65 having the multi-layered structure formed by the InGaAsP/InP layer is the same as the wavelength of the light emission from the InGaAsP layer 65, to thereby increase the light intensity.

Also, the circumference around the semiconductor rod is covered by a surface protective layer 68.

Because the wavelength of light emission from the quantum well layers formed by the InGaAs layer 55 and the InGaAsP layer 65, which are the light-emitting parts of the semiconductor rod shown in FIGS. 14 and 15, is in the range of 1.3 μm-1.5 μm, long distance communications over 100 km are possible when adapted to an optical communication system. In addition, the high resistance InP layer 58 (FIG. 14) or the surface protecting layer 68 (FIG. 15) having similar effects are provided for protection and stabilization of the circumference around the semiconductor rod, which therefore leads to extending the lifetime of the light-emitting element.

FIG. 16 shows another example of the semiconductor rod having the quantum well structure. Namely the semiconductor rod includes the quantum well layer formed by an InGaN layer 75, and the barrier layers formed by an n-type GaN/InGaN multilayer 74 and a p-type GaN/InGaN multilayer 76 which sandwich the quantum well layer. The barrier layers 74, 76 have a multilayered structure formed by repeated lamination of the GaN layer and the InGaN layer. Further, the quantum well structure is sandwiched by an n-type GaN layer 73 and a p-type GaN layer 77.

The cycle of the GaN/InGaN layer of the n-type and p-type GaN/InGaN multilayers 74 and 76 is made equal to the wavelength of the light emission from the quantum well layer, which is the light-emitting part, formed by the InGaN layer 75, to thereby increase the light intensity.

It is noted that the n-type and p-type GaN/InGaN multilayers 74 and 76 may be formed as n-type and p-type GaN/InGaN single layers.

Figure 17:
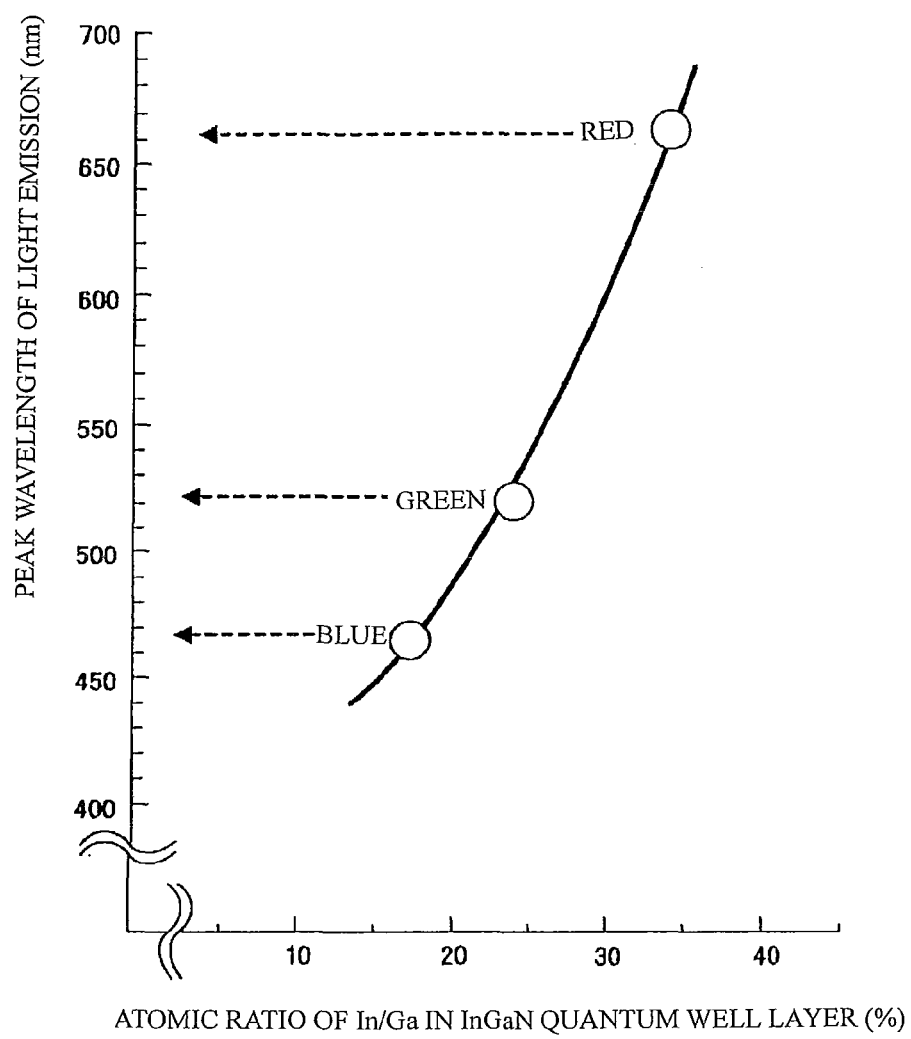
FIG. 17 is a graph showing the In/Ga atom ratio of the quantum well layer of the semiconductor rod relative to the peak wavelength of light emission.

FIG. 17 is a graph plotting the atomic ratio of In to Ga (In atoms/Ga atoms) of the InGaN layer 75, which is the quantum well layer of the semiconductor rod in FIG. 16, relative to the wavelengths of light emission. As shown in FIG. 17, the wavelengths of light emission can be adjusted to any wavelength within the range of blue to red wavelengths, depending on the atomic ratio of In to Ga in the quantum well layer 75. The semiconductor rod shown in FIG. 16 may be covered by AlGaN or a high-resistance protective film, as in the case shown in FIGS. 4 and 5, to protect the circumferential surface of the rod having the p-n junction, which leads to improved reliability of the element.

As mentioned above, the ratio of In atoms to Ga atoms in the InGaN layer can be controlled by adjusting the thickness of the semiconductor rods to be grown. Thus, the area of the openings formed in the insulating film (see FIGS. 1B and 8B) may be adjusted to control the wavelengths of light emission from the semiconductor rod.

Figure 18:
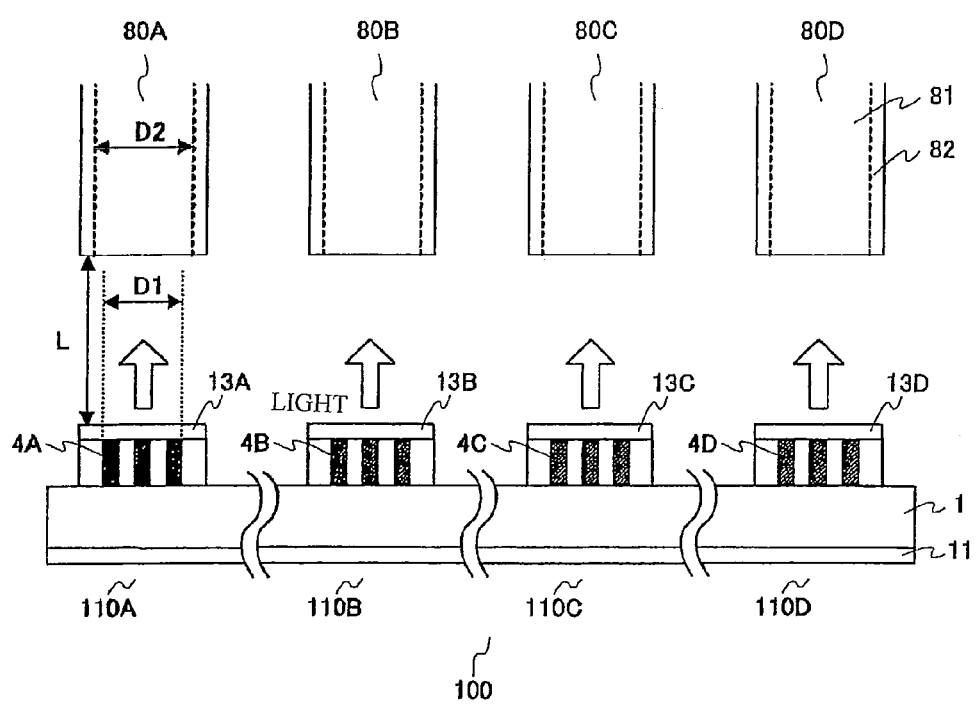
FIG. 18 shows an optical transmitter including a semiconductor light-emitting element array and an optical waveguide.

Optical Transmitter:

FIG. 18 shows a semiconductor light-emitting element array 100 (see FIG. 10) and an optical transmitter having optical waveguides 80A-80D according to the present invention. The semiconductor light emitting element array 100 includes light-emitting elements 110A-110D. The semiconductor light-emitting element array 100 also includes a semiconductor crystal substrate 1, and an n-type electrode 11 arranged adjacent to the semiconductor crystal substrate 1. The respective light-emitting elements 110A-110D include a plurality of semiconductor rods 4A-4D and p-type electrodes 13A-13D which are in contact with the tip ends of the respective semiconductor rods.

The optical waveguides 80A-80D disposed in the vicinity of the p-type electrodes 13A-13D provided at each of the light-emitting elements 110A-110D receive and propagate light from the light-emitting elements. No particular limitations are imposed on the arrangement and materials of the optical waveguides 80. In general, the optical waveguide 80 includes a core 81 and a cladding 82, wherein the light is guided to the core 81 and propagates through it.

In the optical transmitter shown in FIG. 18, it is preferable that arrangement of the light-emitting elements 110A-110D and the optical waveguides 80A-80D is suitably adjusted so that the optical waveguides securely receive the light. For example, as shown in FIG. 18, it is preferable that the core of the optical waveguide is slightly larger than the range of the semiconductor rods disposed at respective locations. This is because the light emitted from the semiconductor rods does not perfectly match the extending direction of the rods and tends to slightly divert its course. Given that the width of the region where each of the semiconductor rods is disposed at respective locations is D1, the distance between the light-emitting elements and the optical waveguides is L, and the expansion angle of light from the light-emitting elements is θ, the diameter of the core D2 is represented by "D2=D1+2L tan θ." The diameter D2 of the usual optical waveguide is about 50 μm to 125 μm, and the expansion angle of light θ is about 5° to 10°.

FIG. 19A shows an optical signal transmitter/receiver including a printed circuit board 120, a semiconductor light-emitting element array chip 100 which contains a plurality of light-emitting elements mounted on the circuit board 120, a light-receiving element array 200 which receives light, and a driver IC 101 and a receiver IC 201 which activate the semiconductor light-emitting element array chip 100 and the light-receiving element array chip 200, and another IC 200.

As shown in FIG. 19B, the semiconductor light-emitting element array 100 may include an optical multiplexer/splitter 300 and an optical waveguide 310. Light beams having different wavelengths from the plurality of light-emitting elements included in the semiconductor light-emitting element array 100 are multiplexed in the optical multiplexer/splitter 300 to form a single optical signal. By guiding the multiplexed light to the optical waveguide 310, a wavelength multiplexed transmission system (i.e., a transmission system capable of transmitting multiple light signals having different wavelengths through only one optical guide) may be provided.

Figure 20:
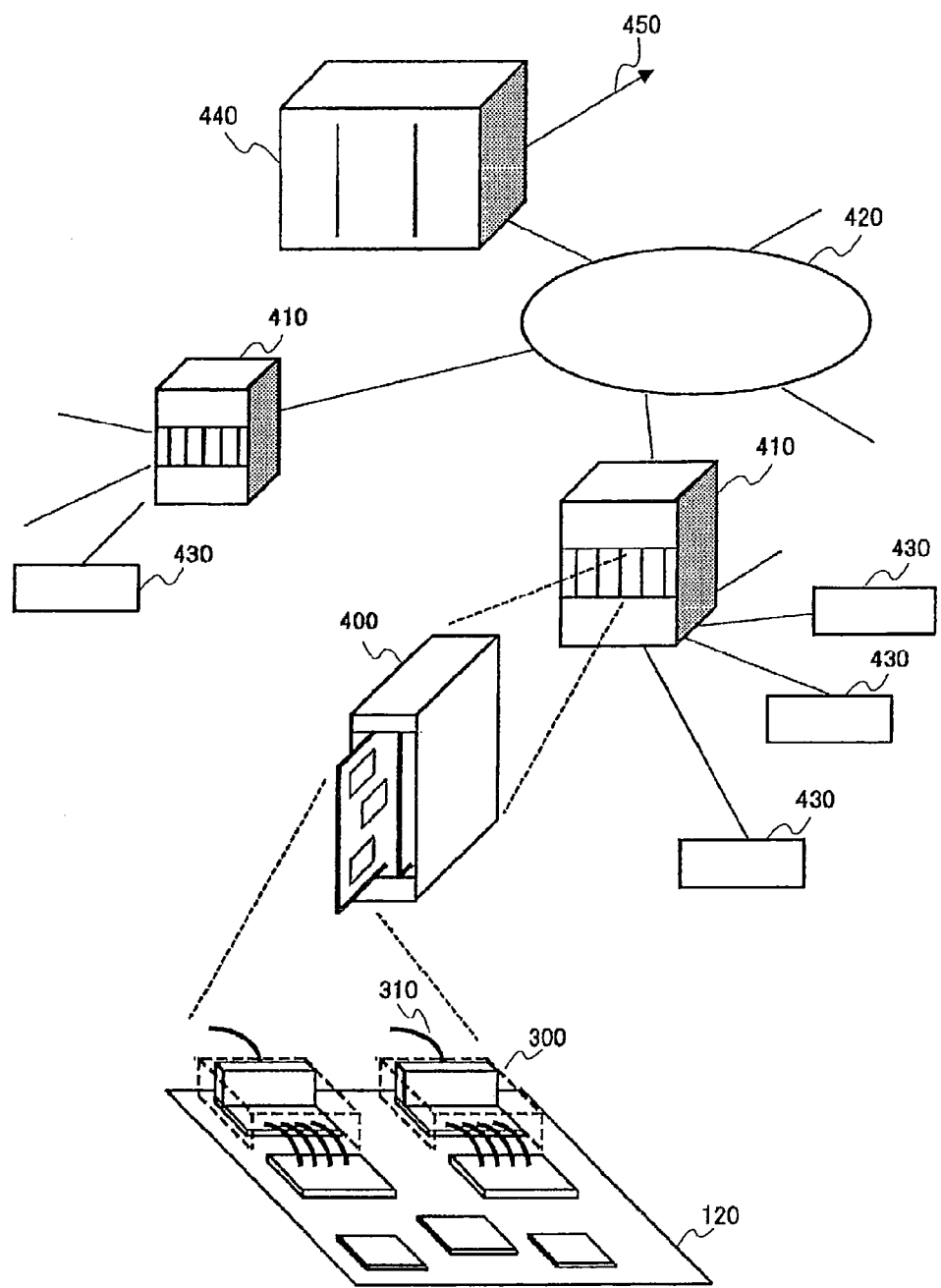
FIG. 20 is a conceptual view showing a network configuration.

FIG. 20 is a schematic view showing a network embodiment of a local area communication network 420 connected to the Internet via a host server 440. The local area communication network 420 is connected to a branch server 410, and the branch server 410 is connected to a terminal PC 430. The branch server 410 stores a server unit 400 in which the optical signal transmitter/receiver including the semiconductor light-emitting element array 100 mounted on the circuit board 120 according to the present invention is provided.

Figure 21:
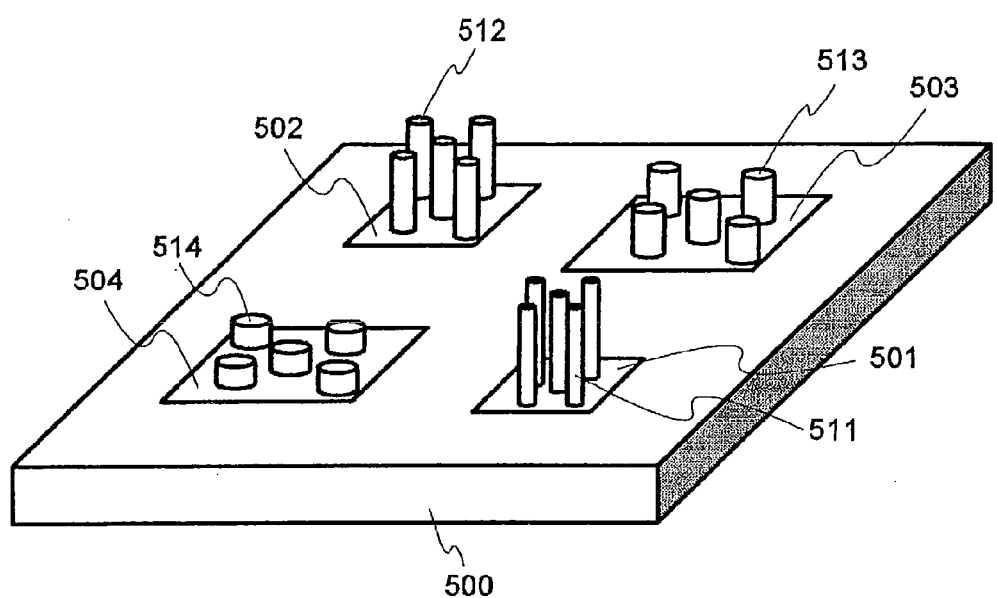
FIG. 21 is a schematic view of the semiconductor light-emitting element array which may be used as a device for optical transmission (i.e., four-wave multiplexed communication)

FIGS. 21 and 22 show other examples of the light-emitting element array according to the present invention when it is applied to the optical transmitter. In FIG. 21, four insulating film pattern portions 501, 502, 503, and 504 are formed on a substrate 500. Each of the insulating film pattern portions 501, 502, 503, and 504 includes five openings. The opening areas of the five openings formed in respective insulating film pattern portions are the same. On the other hand, the opening areas of the openings of the insulating film pattern portions are increased for the insulating film pattern portions 501, 502, 503, and 504, in this order.

Using MOCVD, semiconductor rods 511, 512, 513, and 514 are formed from the substrate 500 through the openings of the insulating pattern portions. As mentioned above, as the opening areas of the openings are dissimilar for the respective insulating pattern portions, it is possible to change the thicknesses and heights of the semiconductor rods 511, 512, 513, and 514. For example, if it is desired to form the semiconductor rods (InGaAs) for LED having p-n junctions, the thickness of the light-emitting portion of InGaAs is set to about 150 nm (the rods 511), about 200 nm (the rods 512), about 250 nm (the rods 513), and about 300 nm (the rods 514). As shown in FIG. 13B, the wavelengths of light emitted from the respective rods are in the range of 910 nm to 950 nm, with the wavelength interval being about 10 nm.

As shown in FIG. 22, an electrode 520 is disposed on the substrate 500, and counter electrodes 521, 522, 523, and 524 opposite to the electrode 520 are disposed at the semiconductor rods 511, 512, 513, and 514, respectively. The electrodes 521, 522, 523, and 524 are electrically connected by wires to electrodes 521', 522', 523', and 524'. The side parts of the semiconductor rods 511, 512, 513 and 514 are embedded in an embedded layer 530.

Above the light-emitting surface of the light-emitting element array shown in FIG. 22, there is disposed a multimode type optical fiber 550 including a core 551 having a diameter of 65 μm and a cladding 552. The light-emitting element array shown in FIG. 22 emits light beams having four types of wavelengths ($\lambda_1$, $\lambda_2$, $\lambda_3$, $\lambda_4$) upward from the surface of the substrate. All light beams are directed to the end face of the core 551 of the optical fiber 550. As such, instead of preparing optical fibers for each wavelength of light emission (see FIG. 18), four-wave multiplexed communication is accomplished using a single optical fiber and without using the optical multiplexer.

Illuminator:

The light-emitting element array according to the present invention may also be used as an illuminator. For example, the light-emitting element array including three types of light-emitting elements, emitting blue, green, and red wavelengths ($\lambda_A$, $\lambda_B$, $\lambda_C$), is used as a three color LED light source. Further, if such a light-emitting element array is combined with an optical fiber, an illuminating fiber is provided.

Figure 23:
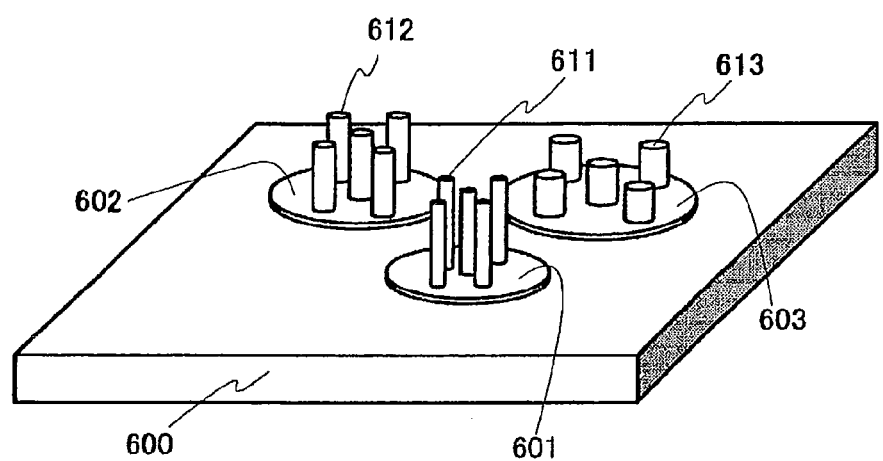
FIG. 23 is a schematic view of the semiconductor light-emitting element array which may be used as an illuminator.

As shown in FIG. 23, three insulating film pattern portions 601, 602, and 603 are formed on a substrate 600. Each insulating film pattern portion is a circle having a diameter of 10 μm, and the spacing between respective pattern portions is 20 μm. Five openings are formed in each of the three insulating film pattern portions 601, 602, and 603. The five openings formed in the insulating film pattern portion 601 have the same opening area, the five openings formed in the insulating film pattern portion 602 have the same opening area, and the five openings formed in the insulating film pattern portion 603 have the same opening area. Meanwhile, the openings formed in the insulating film pattern portion 601 have the smallest areas, and the openings formed in the insulating film pattern portion 603 have the largest areas.

Figure 25:
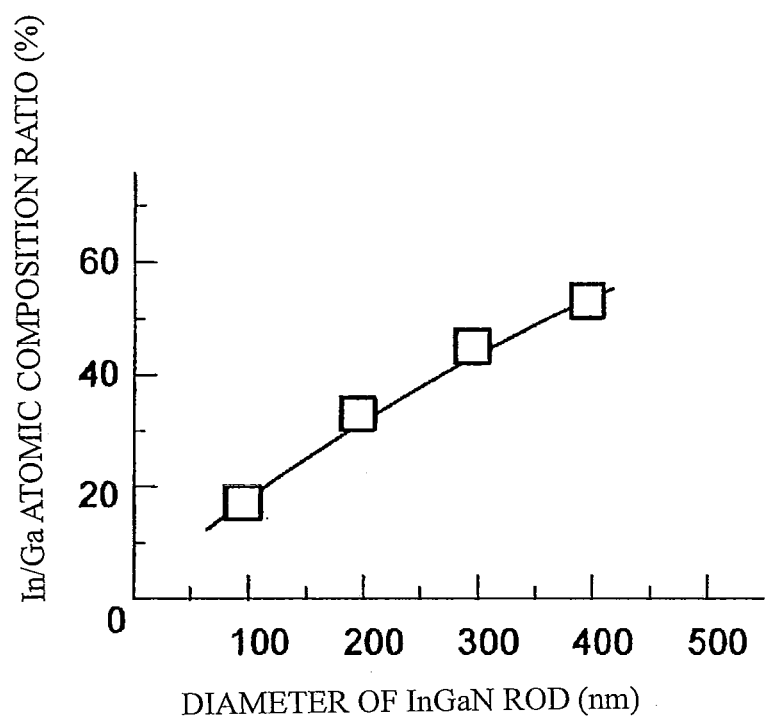
FIG. 25 is a graph showing the atomic ratio of In/Ga of the InGaN semiconductor rod relative to the diameter of InGaN rod.

Using MOCVD, semiconductor rods 611, 612, and 613 are formed through the openings of the insulating film pattern portions from the substrate 600. As mentioned above, the opening areas of the openings differ among insulating pattern portions, so that the semiconductor rods 611, 612, and 613 may have different thicknesses and heights. For example, if it is desired to form semiconductor rods (InGaN) having p-n junctions, the atomic composition ratio In/Ga is adjusted corresponding to the thickness (diameter) of the rods (see FIG. 25) to thereby control the wavelength of light emission. Thus, three types of light beams consisting of blue, green and red ($\lambda_A$, $\lambda_B$, $\lambda_C$) are emitted from the semiconductor rods 611, 612 and 613. Namely, the diameters of the InGaN semiconductor rods are set to about 100 nm (the rods 611), about 150 nm (the rods 612), and about 200 nm (the rods 613), so that blue light is emitted from the rods 611, green light is emitted from the rods 612, and red light is emitted from the rods 613.

As shown in FIG. 24, an electrode 620 is disposed on the substrate 600, and counter electrodes 621, 622, and 623 opposite the electrode 620 are disposed at the respective semiconductor rods 611, 612, and 613. The electrodes 621, 622, and 623 are electrically connected by wire to electrodes 621', 622' and 623'. The side parts of the semiconductor rods 611, 612 and 613 are embedded in an embedded layer 630.

Above the light-emitting surface of the light-emitting element array shown in FIG. 24, there is disposed a multimode type optical fiber 650 including a core 651 having a diameter of 50 μm and a cladding 652. The light-emitting element array shown in FIG. 24 emits light beams having three types of wavelengths ($\lambda_A$, $\lambda_B$, $\lambda_C$) upward from the surface of the substrate. All light beams are directed to the end face of the core 651 of the optical fiber 650. Consequently, low-loss light coupling capable of long-distance transmission of light is accomplished.

Applicable Field of the Invention

A semiconductor light-emitting element array according to the present invention is applicable to various purposes. In recent years, there is an increasing need for high-speed information (signal) transmission, as the transmission and switching of information using personal computers (PCs) via the Internet are spreading in wider areas and with larger capacities. To address this need, the basic industries have started to develop the optical communication technology using optical fibers for long-distance communication networks, and this technology is now spreading to end users for personal use. Meanwhile, for short-distance communications within a few hundred meters to a few kilometers used in offices and schools, a conventional communication network using electric signals has been developed, and the need for a optical communication network using light is sparse.

Recently, however, there arises a social problem of leakage of confidential information using terminal PCs located at advanced technology divisions of industries, financial institutions, and public institutions. To solve this problem, network construction has been started to realize a new network where no hard discs (HDs) or rewritable semiconductor flash memories are provided in terminal PCs. In this type of network, data processing is carried out via terminal PCs by continuously communicating data to and from a host computer (HC), and processed data are stored only in the HC. As such, even faster signal transmission speed is inevitably necessary between the HC and individual PCs connected therewith.

To respond to such needs, optical transmission is advantageous over the conventional electrical signal transmission. Among optical transmission systems, a parallel transmission system using more than one signal transmission line and a wavelength multiplexing system using a plurality of waves simultaneously, rather than one type of wavelength, are suitable for large capacity communications. The semiconductor light-emitting element array according to the present invention is preferably adapted to such optical transmission systems, including the parallel transmission system and the wavelength multiplexing system.

The semiconductor light-emitting element array according to the present invention may also be used as an illuminator.

REFERENCES SIGNS LIST

| | |
|---|---|
| 1: | Semiconductor Crystal Substrate |
| 2: | Insulating Film |
| 2A-2H: | Insulating Film Portions |
| 3A-3H: | Openings |
| 4: | Semiconductor Rod |
| 4A-4H: | Semiconductor Rods |
| p1A-p1D, p2A-p2D: | Center-to-center Distance Between Openings |
| hA-hH: | Height of Semiconductor Rods |
| 11: | n-type Electrode |
| 12: | Insulating Material |
| 13: | p-type Electrode |
| 13A-13H: | p-type Electrodes |
| 23: | n-type GaAs Layer |
| 24: | n-type AlGaAs layer (Barrier Layer) |
| 25: | GaAs Layer (Quantum Well Layer) |
| 26: | p-type AlGaAs layer (Barrier Layer) |
| 27: | p-type GaAs layer |
| 28: | AlGaAs Laterally Grown Film |
| 33: | n-type GaAs Layer |
| 34: | n-type GaAs/AlGaAs Multilayer Structure |
| 35: | GaAs/AlGaAs Quantum Well Layer |
| 36: | p-type GaAs/AlGaAs Multilayer Structure |
| 37: | p-type GaAs Layer |
| 43: | n-type GaAs Layer |
| 44: | n-type GaAs Layer |
| 45: | InGaAs Layer |
| 46: | p-type GaAs Layer |
| 47: | p-type GaAs Layer |
| 53: | n-type InP Layer |
| 54: | n-type InGaAs P Layer |
| 55: | InGaAs Layer |
| 56: | p-type InGaAsP Layer |
| 57: | p-type InP Layer |
| 58: | High-Resistance InP |
| 63: | n-type InP Layer |
| 64: | n-type InGaAsP/InP Multilayer Structure |
| 65: | InGaAsP Quantum Well Layer |
| 66: | n-type InGaAsP/InP Multilayer |
| 67: | p-type InP Layer |
| 68: | Surface Protective Layer |
| 73: | n-type GaN Layer |
| 74: | n-type GaN/InGaN Layer |
| 75: | InGaN Layer |
| 76: | p-type GaN/InGaN Layer |
| 77: | p-type GaN Layer |
| 80A-80D: | Optical Waveguides |
| 81: | Core |
| 82: | Cladding |
| 100: | Semiconductor Light-Emitting Element Array |
| 101: | Driver IC |
| 110A-110D: | Light-Emitting Elements |
| 120: | Printed Circuit Board |
| 200: | Light-Receiving Array Chip |
| 201: | Receiver IC |
| 210: | Other IC |
| 300: | Optical Multiplexer/Splitter |
| 310: | Optical Waveguide |
| 400: | Server Unit |
| 410: | Branch Server |
| 420: | Local Communication Network |
| 430: | Terminal PC |
| 440: | Host Server |
| 450: | Internet |
| 500: | Semiconductor Crystal Substrate |
| 501-504: | Insulating Film Pattern Portions |
| 511-514: | Semiconductor Rods |
| 520: | Electrode |
| 521-524: | Electrodes |
| 521'-524': | Electrodes |
| 530: | Embedded Layer |
| 550: | Optical Fiber |
| 551: | Core |
| 552: | Cladding |
| 600: | Semiconductor Crystal Substrate: |
| 601-603: | Insulating Film Pattern Portions |
| 611-613: | Semiconductor Rods |
| 620: | Electrode |
| 621-623: | Electrodes |
| 621'-623': | Electrodes |
| 630: | Embedded Layer |
| 650: | Optical Fiber |
| 651: | Core |
| 652: | Cladding |

The invention claimed is:

1. A semiconductor light-emitting element array, comprising:
   a semiconductor crystal substrate;
   an insulating film disposed on a surface of the semiconductor crystal substrate,
      the insulating film being separated into two or more regions,
      each of the two or more regions having two or more openings exposing the surface of the substrate;
   a semiconductor rod extending from the surface of the substrate upward through each of the openings, the semiconductor rod having an n-type semiconductor layer and a p-type semiconductor layer being laminated in its extending direction, thereby providing a p-n junction;
   a first electrode connected to the semiconductor crystal substrate; and
   a second electrode connected to an upper portion of the semiconductor rod,
   wherein the height of the semiconductor rod as measured from the substrate surface varies among the two or more regions, and wherein an average area of the openings varies among the two or more regions.

2. A semiconductor light-emitting element array, comprising:
   a semiconductor crystal substrate;
   an insulating film disposed on a surface of the semiconductor crystal substrate,
      the insulating film being separated into two or more regions,
      each of the two or more regions having two or more openings exposing the surface of the substrate;
   a semiconductor rod extending from the surface of the substrate upward through each of the openings, the semiconductor rod having an n-type semiconductor layer and a p-type semiconductor layer being laminated in its extending direction, thereby providing a p-n junction;
   a first electrode connected to the semiconductor crystal substrate; and
   a second electrode connected to an upper portion of the semiconductor rod,
   wherein the height of the semiconductor rod as measured from the substrate surface varies among the two or more regions, wherein an average center-to-center distance of the openings varies among the two or more regions.

3. The semiconductor light-emitting element array according to claim 1 or 2, wherein the semiconductor rod has a hetero-junction.

4. The semiconductor light-emitting element array according to claim 1 or 2, wherein the semiconductor rod has a quantum well structure.

5. The semiconductor light-emitting element array according to claim 1 or 2, wherein the semiconductor crystal substrate is formed by a semiconductor material selected from the group consisting of GaAs, InP, Si, InAs, GaN, SiC, and $Al_2O_3$, and
the surface of the substrate where the insulating film is provided is a crystal axis (111) surface.

6. The semiconductor light-emitting element array according to claim 1 or 2, wherein the semiconductor rod is formed by metal organic chemical vapor deposition or molecular beam epitaxy.

7. The semiconductor light-emitting element array according to claim 1 or 2, wherein
the first electrode is an n-electrode, and
the second electrode is a p-electrode and a transparent electrode.

8. The semiconductor light-emitting element array according to claim 1 or 2, wherein
the first electrode is a p-electrode, and
the second electrode is an n-electrode and a transparent electrode.

9. A method of manufacturing the semiconductor light-emitting element array according to claim 1 or 2, comprising the steps of:
A) preparing the semiconductor crystal substrate with a crystal axis (111) surface covered by the insulating film, the insulating film being divided into two or more regions,
each of the two or more regions having two or more openings exposing the crystal axis (111) surface; and
B) forming the semiconductor rod from the surface of the semiconductor crystal substrate covered by the insulating film by metal organic chemical vapor deposition or molecular beam epitaxy, including the steps of forming the n-type semiconductor layer and forming the p-type semiconductor layer.

10. An optical transmitter, comprising:
the semiconductor light-emitting element array according to claim 1 or 2, and
an optical waveguide disposed in each of the two or more regions and receiving light emission from the semiconductor rod located in the respective two or more regions.

11. An optical transmitter, comprising:
the semiconductor light-emitting element array according to claim 1 or 2, and
an optical waveguide for receiving light emission from the semiconductor rod located in the respective two or more regions.

12. An optical transmitter, comprising:
the semiconductor light-emitting element array according to claim 1 or 2;
an optical multiplexer for multiplexing light emission from the semiconductor rods located the respective two or more regions; and
an optical waveguide for receiving light emission multiplexed in the multiplexer.

13. An illuminator, comprising:
the semiconductor light-emitting array according to claim 1 or 2; and
an optical waveguide for receiving light emission from the semiconductor rods located in the respective two or more regions.

14. An illuminator, comprising:
the semiconductor light-emitting element array according to claim 1 or 2;
an optical multiplexer for multiplexing light emission from the semiconductor rods located in the respective two or more regions; and
an optical waveguide for receiving light emission multiplexed in the multiplexer.

\* \* \* \* \*